(12) United States Patent
Alhashash

(10) Patent No.: US 9,165,402 B2
(45) Date of Patent: Oct. 20, 2015

(54) 3D MODELING USER INTERFACE METHOD

(71) Applicant: Yousef Yacoub Eid Alhashash, Andalus (KW)

(72) Inventor: Yousef Yacoub Eid Alhashash, Andalus (KW)

( * ) Notice: Subject to any disclaimer, the term of this patent is extended or adjusted under 35 U.S.C. 154(b) by 346 days.

(21) Appl. No.: 13/675,985

(22) Filed: Nov. 13, 2012

(65) Prior Publication Data

US 2014/0137050 A1    May 15, 2014

(51) Int. Cl.
*G06T 17/10* (2006.01)
*G06F 17/50* (2006.01)
*G06T 19/20* (2011.01)

(52) U.S. Cl.
CPC .............. *G06T 17/10* (2013.01); *G06F 17/50* (2013.01); *G06T 19/20* (2013.01); *G06T 2200/24* (2013.01); *G06T 2219/2016* (2013.01); *G06T 2219/2021* (2013.01)

(58) Field of Classification Search
USPC ......................................................... 715/848
See application file for complete search history.

(56) References Cited

U.S. PATENT DOCUMENTS

| | | | |
|---|---|---|---|
| 6,426,745 B1 | 7/2002 | Isaacs et al. | |
| 6,768,486 B1 * | 7/2004 | Szabo et al. | G06T 17/20 345/420 |
| 7,062,722 B1 | 6/2006 | Carlin et al. | |
| 7,116,324 B2 * | 10/2006 | Kaye et al. | G06T 7/0065 345/419 |
| 7,676,348 B2 | 3/2010 | Okada | |
| 7,936,352 B2 * | 5/2011 | Baran et al. | G06T 17/30 345/420 |
| 2006/0017723 A1 | 1/2006 | Baran et al. | |
| 2011/0181589 A1 | 7/2011 | Quan et al. | |

FOREIGN PATENT DOCUMENTS

WO    WO 2006078237 A1 *  7/2006  ............ G06T 7/0051

OTHER PUBLICATIONS

Mark Gerhard et al., "Mastering Autodesk 3ds Max Design 2010," Sybex, Sep. 2009, pp. 66, 10, 116, 120, 121, 132, 133, 139-146, 201, 228, 229, 265, and 843.*

* cited by examiner

*Primary Examiner* — Matt Kim
*Assistant Examiner* — Maryam Ipakchi
(74) *Attorney, Agent, or Firm* — Richard C. Litman

(57) ABSTRACT

The 3D modeling user interface (UI) method provides a 2D scalable grid on a computer screen that allows a user to extrude a 3D shape therefrom. The 3D shape is then presented on the display screen, which also shows the grid that the shape was extruded from. In addition to 2D grids, the UI allows the user to define 2D concentric circular patterns on a surface of the 3D shape, from which the user can extrude a 3D projection of the concentric circular patterns. A previously defined grid can be extended or bent into an arcuate or curvy grid according to manipulations by the user. Moreover a grid can be folded back on itself by the user. Additionally the UI provides groups of user-defined wavy splines that can be extruded from a displayed surface.

3 Claims, 30 Drawing Sheets

Square
(Our Example)

Triangle
(No Sub-Grid)

Irregular Shape
(Sub-Grid=2 for X & Y)

Explanation

Module Dim

Modules Numbers    X-Coordinator

Sub-Grid

3D MODELING USER INTERFACE METHOD

BACKGROUND OF THE INVENTION

1. Field of the Invention

The present invention relates to 3-dimensional modeling, and particularly to a 3D modeling user interface method incorporating 2D grids and 2D concentric closed curves from which 3D objects can be extruded.

2. Description of the Related Art

Many users of 3D CAD systems are skilled in 3D modeling techniques and design 3D models professionally. These experienced users understand how to manipulate control points and meshes used to define a surface, and how to manipulate vertices and edges that are surface entities. A 3D CAD system that provides a simple and intuitive means to create and modify the shape of 3D models of various complexities would be advantageous for those not skilled in 3D modeling techniques, as well as for those that are. A 3D CAD system that allows users to interactively deform complex models by direct manipulation of low order structures, while preserving the smoothness of the surface throughout the model, could enable users to create smooth shapes in a natural, fast, and simple way, and thereby enhance the capabilities and ease of use of a 3D CAD system.

Thus, a 3D modeling user interface method solving the aforementioned problems is desired.

SUMMARY OF THE INVENTION

The 3D modeling user interface (UI) method provides a 2D scalable grid on a computer screen that allows a user to extrude a 3D shape therefrom. The 3D shape is then presented on the display screen, which also shows the grid that the shape was extruded from. In addition to 2D grids, the UI allows the user to define 2D concentric circular patterns on a surface of the 3D shape, from which the user can extrude a 3D projection of the concentric circular patterns.

A previously defined grid can be extended or bent into an arcuate grid according to manipulations by the user. Moreover a grid can be folded back on itself by the user. Additionally the UI provides groups of user-defined arcuate splines that can be extruded from a displayed surface.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The 3D modeling user interface (UI) method provides on a computer screen a 2D scalable grid that allows a user to extrude a 3D shape therefrom. The 3D shape is then presented on the display screen, which also shows the grid that the shape was extruded from. In addition to 2D grids, the UI allows the user to define 2D concentric circular patterns on a surface of the 3D shape, from which the user can extrude a 3D projection of the concentric circular patterns.

The method results in software that provides a grid that is used to locate structure. For example, in architectural drawings, walls, doors, and windows are easily formed and located using the grid. The grid is a 3D CAD design tool, which may also be used as a drafting tool, and can be used generally to create any shape or form.

A previously defined grid can be extended or bent into an arcuate or curvy grid according to manipulations by the user. Moreover a grid can be folded back on itself by the user. Additionally the UI provides groups of user-defined arcuate or wavy splines that can be used to extrude a 3D shape from a displayed surface.

Figure 1:
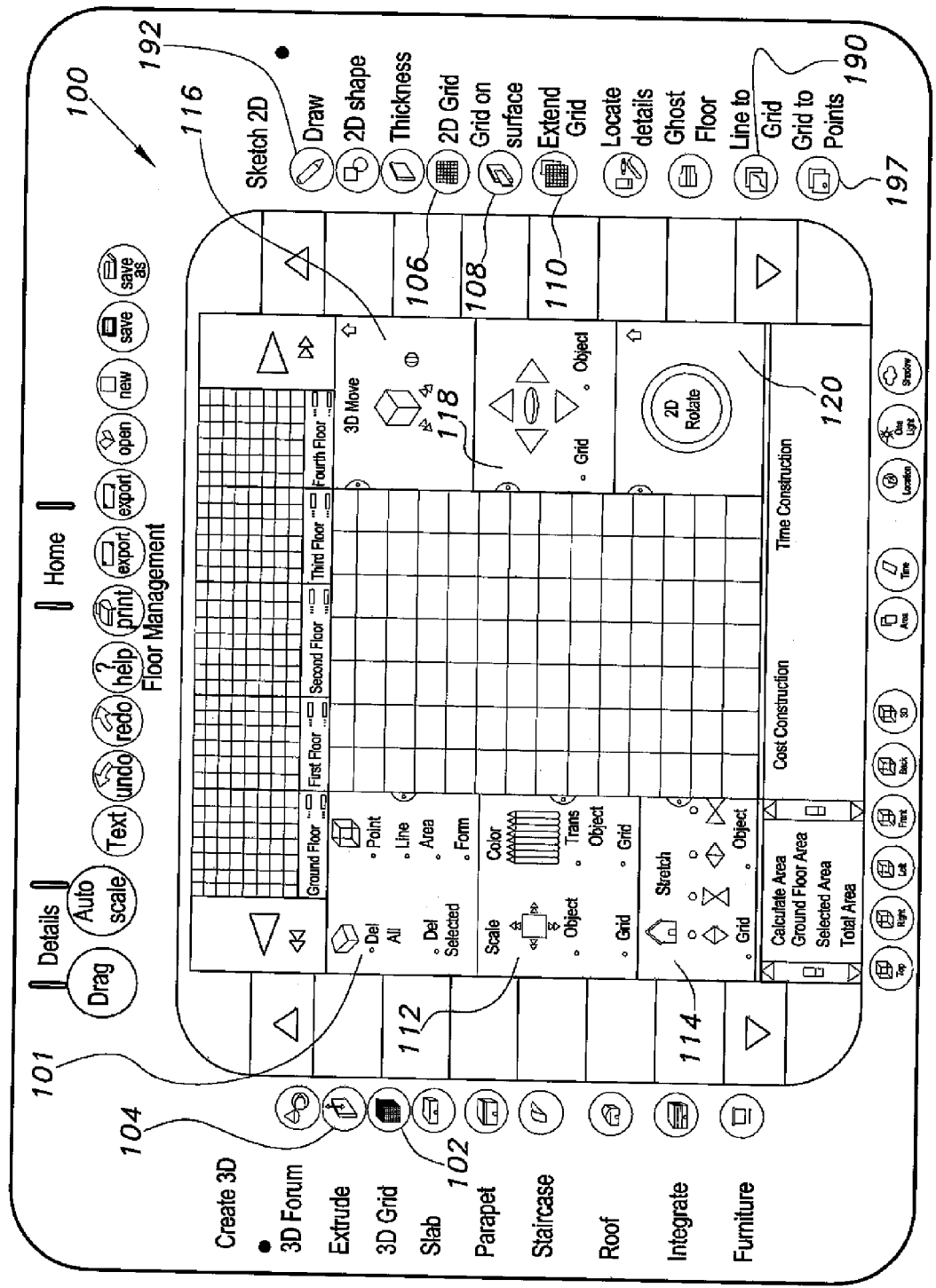
FIG. 1 is a screenshot of a front page user interface of software implementing the 3D modeling user interface method according to the present invention.

As shown in FIG. 1, the graphical user interface control page (GUI control page) 100 accepts inputs from the user to produce the grids, shapes, and extrusions therefrom. GUI control page 100 includes a 3D grid button 102, an extrude button 104, a 2D grid button 106, a grid on surface button 108, an extend grid button 110, a directional scaling button 112, a stretching deformation button 114, a 3D move button 116, a grid/object directional control button 118, and a 2D rotate button 120.

Figure 2:
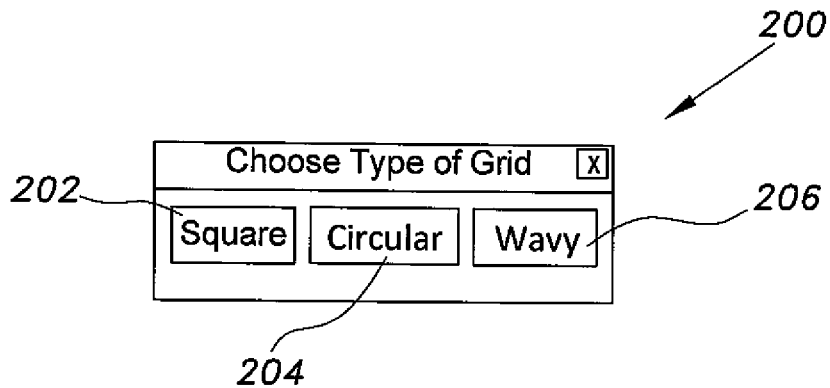
FIG. 2 is a grid type selection box presented by the 3D modeling user interface method according to the present invention.
Figure 3:
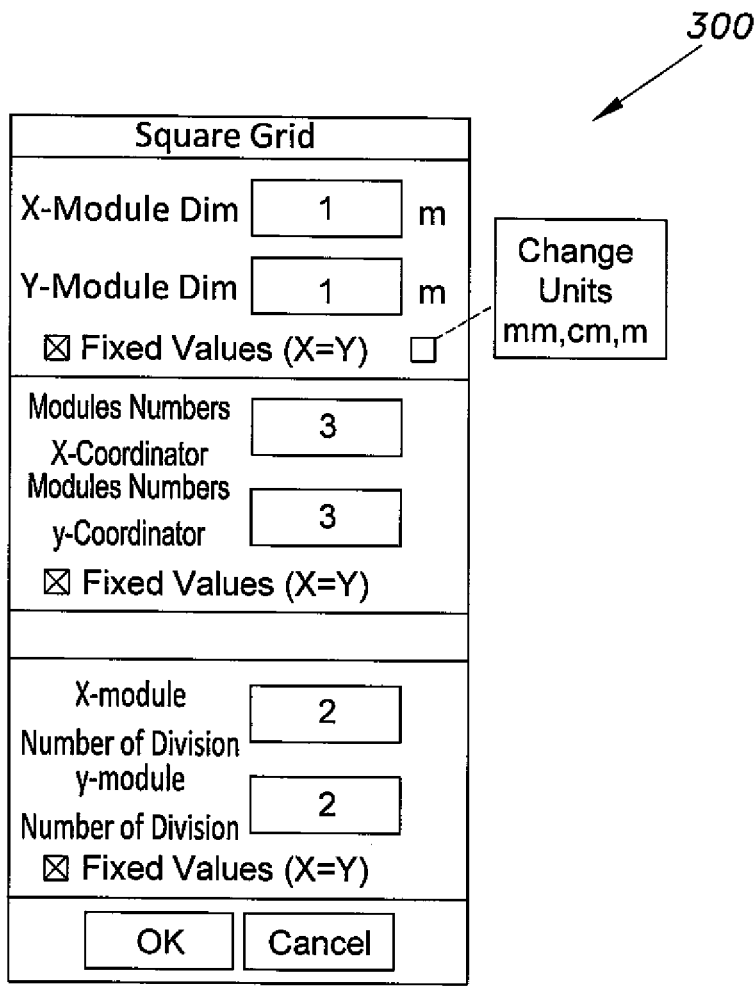
FIG. 3 is a square grid parameter entry dialog presented by the 3D modeling user interface method according to the present invention.
Figure 4:
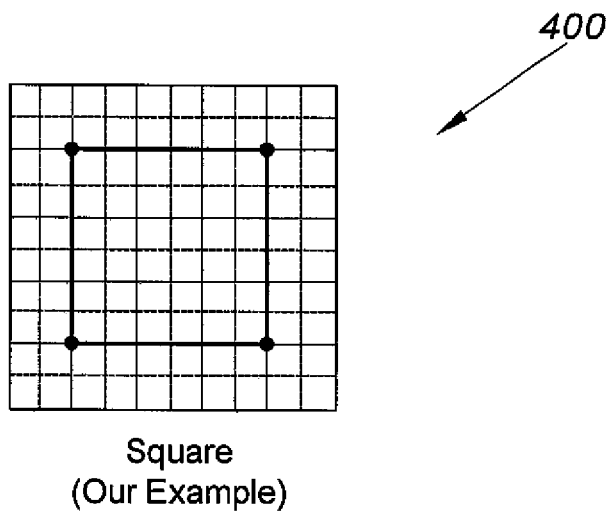
FIG. 4 is a selectable square grid type presented by the 3D modeling user interface method according to the present invention.
Figure 5:
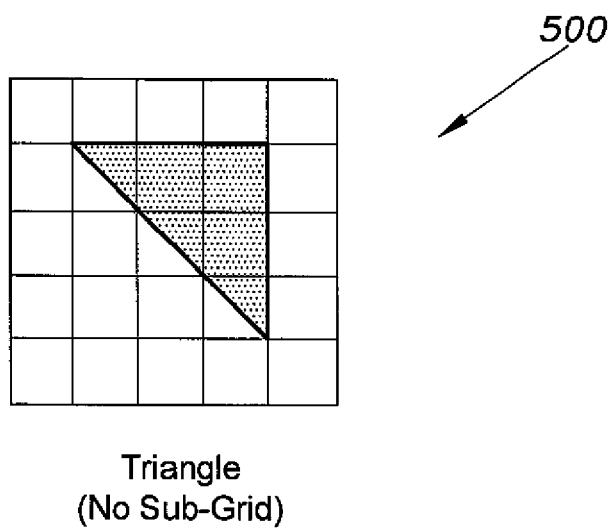
FIG. 5 is a selectable triangle grid type presented by the 3D modeling user interface method according to the present invention.
Figure 6:
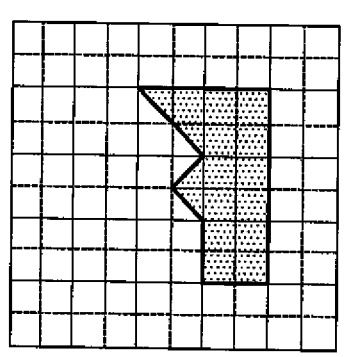
FIG. 6 is a selectable irregular shaped grid type presented by the 3D modeling user interface method according to the present invention.
Figure 7:
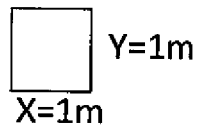
FIG. 7 illustrates module dimensions module numbers and sub-grid divisions of the 3D modeling user interface method according to the present invention.
Figure 7:
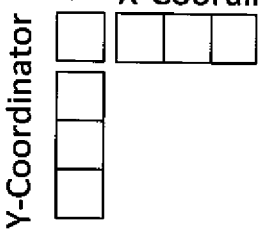
Figure 7:
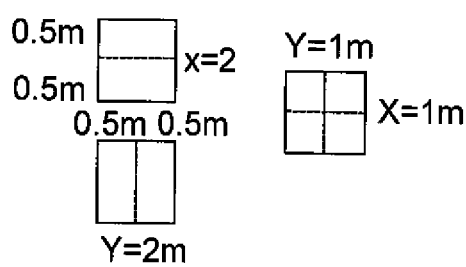

FIGS. 2, 3, and 7 illustrate an exemplary sequence of user actions that create a box from a square grid. The 2D grid button 106 is clicked on and responds by providing a choose grid type dialog box 200. Dialog box 200 has a square grid selector 202, a circular grid selector 204 and a wavy grid selector 206. In this example, the user selects the square grid selector 202. Selecting button 202 opens a square grid dialog box 300 that has a variety of user entry fields, allowing customization of the square grid that will be created. In this example, the user enters 1 m in X-Module Dimension. The Y-Module Dimension is filled automatically to a value of 1 m because the Fixed Values (X=Y) checkbox was selected. Also when 3 is entered into Modules Numbers X-Coordinator, the corresponding Y-Coordinator value is auto-filled to 3 because the associated fixed values (X=Y) checkbox was marked. The X and Y module Number of Division entries follow the same pattern. (Note that: X=2 subdivides X=1 m in Main-Grid, into 0.5 m horizontally. Similarly, if Y=1 m in Main-Grid, Y=2 subdivides the grid such that X is divided into 0.5 m vertically). This operation causes a Sub-Grid (Dotted Grid) Option 706 (as shown in FIG. 7) to be presented to the user. The user then chooses Number of Division for Modules/Units Grid. The example in dialog box 300 shows 2 being entered in X module. Y module is auto-filled with 2 because the user checked fixed X, Y values (X=Y) checkbox. Clicking OK confirms the selections made. When the user moves mouse pointer into any intersecting lines, points on the graphic will shine. The user can then pick any of those points with Left-Click of the mouse to draw any shape, e.g., square, triangle or irregular as shown in FIG. 4, 400, FIG. 5, 500, and FIG. 6, 600. When the user clicks on the points and drags the mouse, a line will be created. The user can match this line into any of the points to create open or closed shapes, as desired. When the user is finished picking the last point, the software accepts a click on "Esc" or "Enter" on the keyboard to complete the graphics operation.

Figure 8:
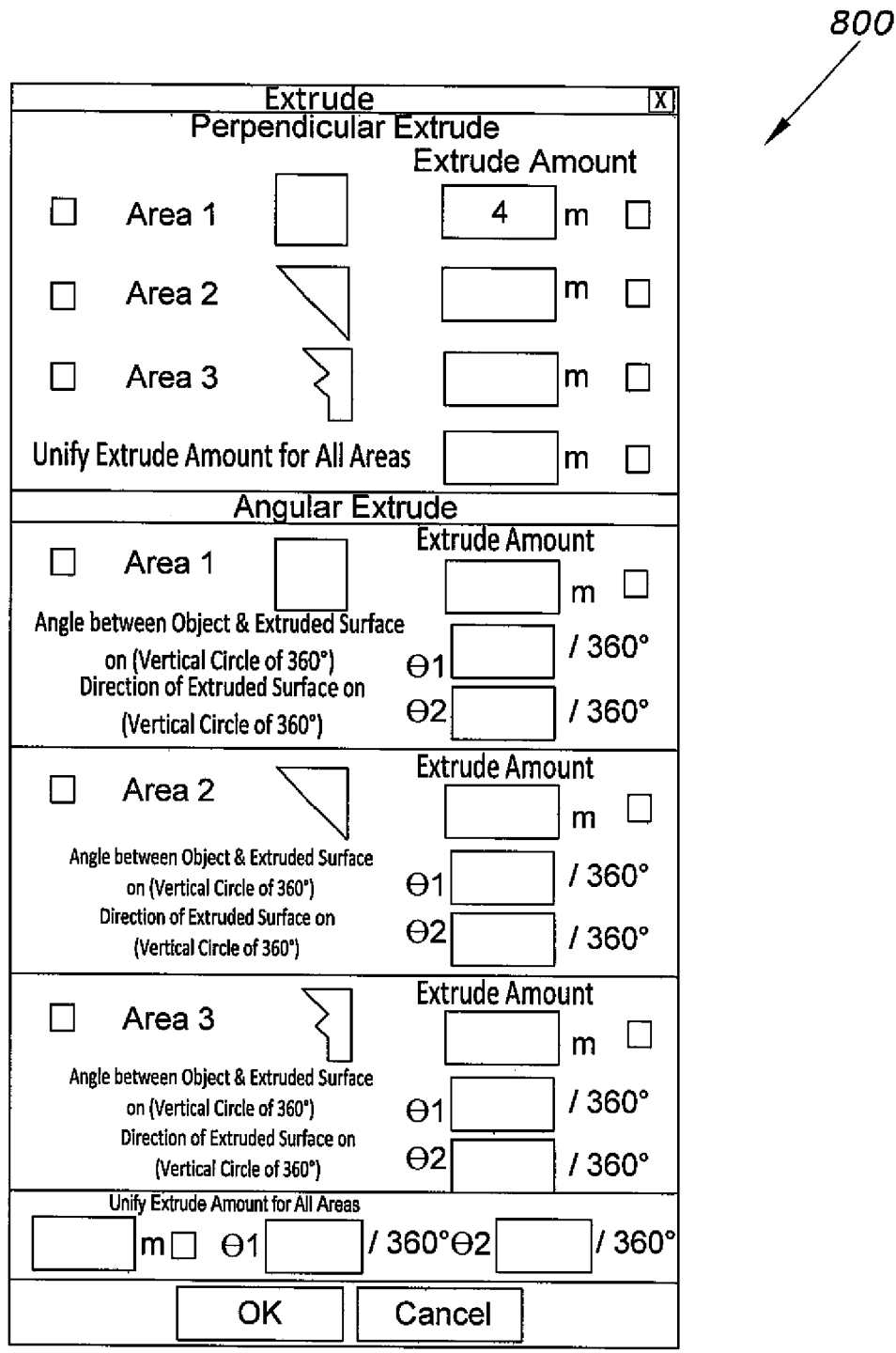
FIG. 8 shows a screenshot of the extrude parameters page of the 3D modeling user interface method according to the present invention.
Figure 10:
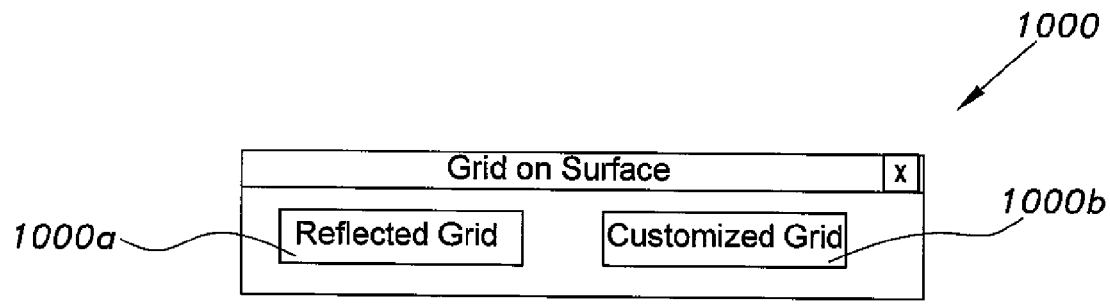
FIG. 10 shows a reflected/customized grid selection dialog box in a 3D modeling user interface method according to the present invention.
Figure 11:
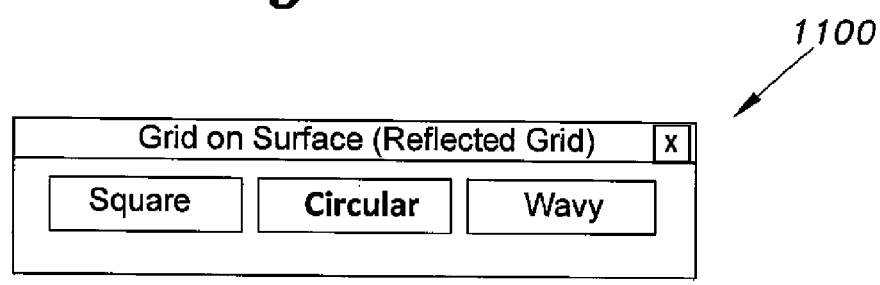
FIG. 11 shows a grid on surface selection dialog box in a 3D modeling user interface method according to the present invention.

A Create 3D list is provided from which the user can select an extrude command in the Extrude Management dialogue box 800 (shown in FIG. 8) containing each area that the user can draw. In the example shown the user has entered 4 m as a Height for Extrusion in the square Area 1. Responsively, graphical operations of the present invention converts square Area 1 into a box. If a negative (−) Extrude Amount is entered, the extrusion will extend downward from the grid. Height up/down may be changed anytime on Extruded Forms box 800, but any Grid on Surface 1000, (shown in FIG. 10. This screen has a reflected Grid button 1000a and a Customized Grid button 1000b), or sub-extrusion related to (Grid on Surface 1000) will automatically disappear because their dimensions have been changed too by extension up or down with respect to the grid. Thus, the Grid on Surface would have to be redesigned or re-divided.

Figure 9:
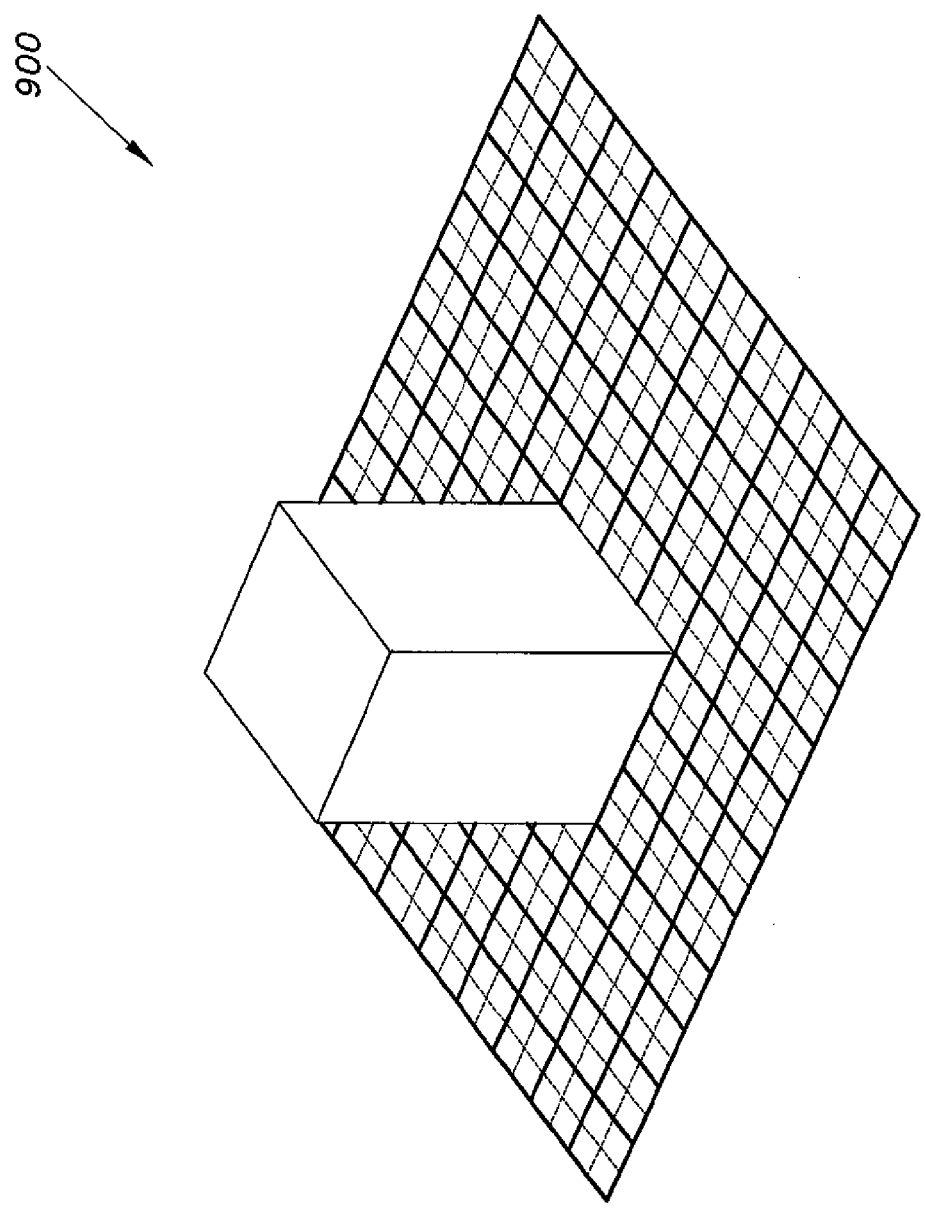
FIG. 9 shows an extruded 3D structure based on user input of extrusion parameters in a 3D modeling user interface method according to the present invention.

The Extrude Command also has an option that assists user specification of the extrusion direction and angle. The 3D modeling user interface provides two angle fields on the Extrusion dialog box 800. The θ1 angle field specifies the angle between the extruded area and the grid which can be represented or explained by Vertical Circle with 360°. The θ2 angle field specifies Direction of the extruded area on Horizontal Circle with 360°. The default is Perpendicular Extrusion to make the extruded area extend perpendicular to the grid, i.e., (θ1-90°), and in this case, θ2 is not equal 0°, and is not available at all. If the extruded form is inclined (θ1=80°), thus meaning there is a direction, and consequently there is a value for θ2. The perpendicular example 900, in FIG. 9, shows a box created from a square grid.

Figure 12:
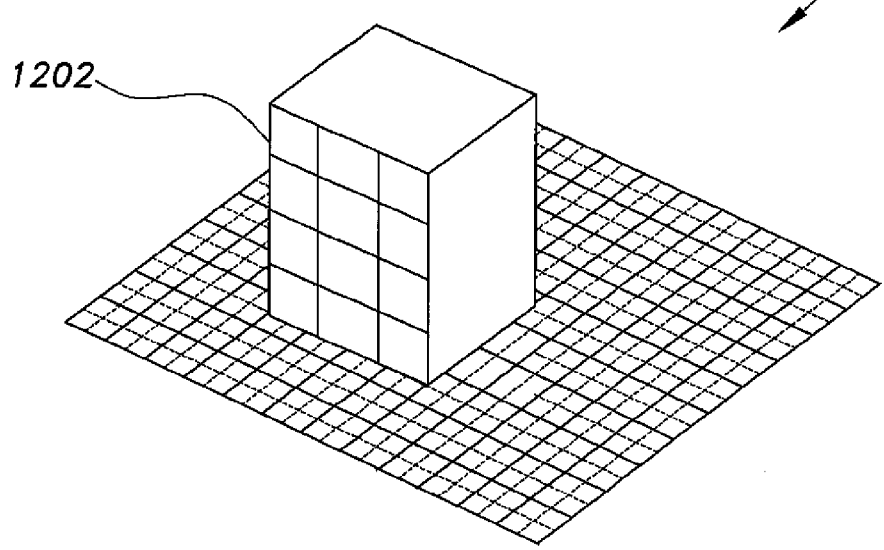
FIG. 12 shows the grid applied to the surface of a cube in a 3D modeling user interface method according to the present invention.
Figure 13:
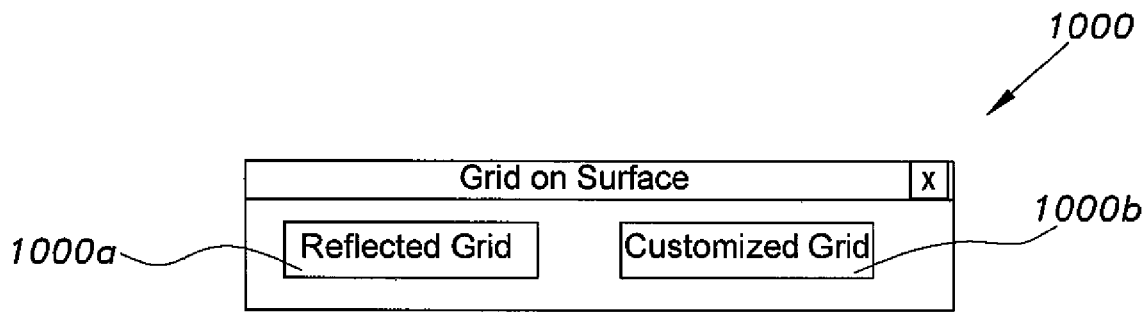
FIG. 13 shows the previous selection dialog box, this time with a customized grid selected, in a 3D modeling user interface method according to the present invention.
Figure 14:
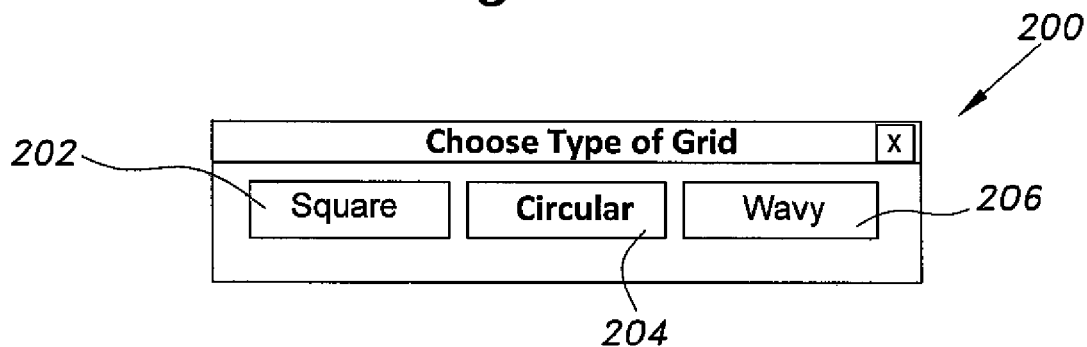
FIG. 14 shows the customized grid type selection dialog box in a 3D modeling user interface method according to the present invention.

For creating a grid on a surface, as shown in FIG. 13, the software of the 3D modeling user interface method provides a first option, Reflected Grid 1300a which reflects any Grid in the scene/screen whether square circular or wavy on the selected surface of the box. In the second option, the method provides a Customized Grid selection 1300b, which is similar to creating the square grid in previous example supra. In the first option, the user selects Grid on Surface from the Create 3D list. Then the user places the mouse cursor over and clicks on the desired Surface of the Box upon which the grid will be created. The software then presents dialogue box 1300. When the user clicks on Reflected Grid 1300a, the software presents the user with 3 Types of Grids to choose from in dialog box 200. If the user did not create Circular/Wavy Grid in the main Screen before, then Circular/Wavy Grid lettering is grayed out in dialog box 200 and not available. The user then clicks on the Square Grid button provided by dialog box 200. If more than one Grid on Screen was created, the user must select which grid by (left-clicking of the mouse) after this step. FIG. 12 shows the successfully created grid 1202 on the box in simulated screenshot 1200.

Alternatively, the user may click on Grid on Surface from the Create 3D list. Clicking on the desired Surface of the Box selects the surface upon which the grid will be created. The software then provides dialogue box 1000, but this time the user clicks on the Customized Grid button 1000b. The Choose Type of Grid dialog box 200 then opens, and the user selects square grid by clicking on the Square button in dialog box 200. The software then presents the Grid on Surface (Square Grid) dialog box 1500. The user then enters division values 4 (divides (X) into 4 Parts) and 3 (divides (Y) into 3 Parts) in the X-Horizontal and Y-Vertical space fields, respectively. Fixed Values (X=Y) is left unchecked. Responsively, the 3D modeling user interface software creates a 3×4 grid on a Box Surface.

Figure 15:
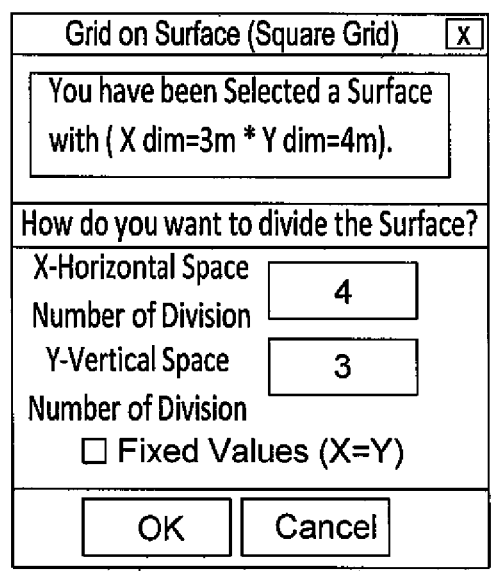
FIG. 15 shows the square grid on surface parameter entry dialog box in a 3D modeling user interface method according to the present invention.
Figure 16:
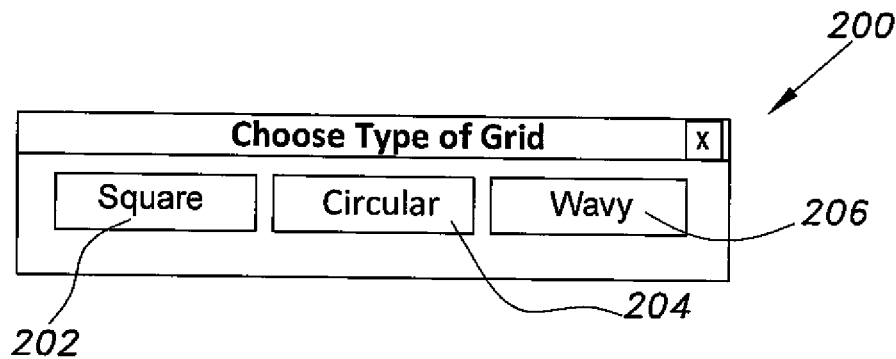
FIG. 16 shows the grid type selection dialog box, the user selects square for a sub-grid selection procedure in a 3D modeling user interface method according to the present invention.
Figure 17:
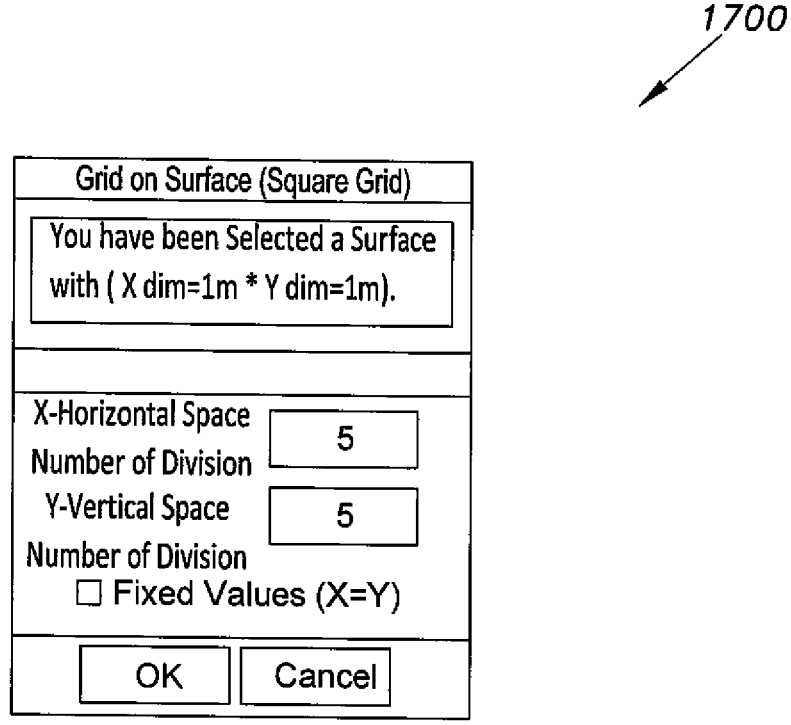
FIG. 17 shows the square grid division dialog box in a 3D modeling user interface method according to the present invention.
Figure 18:
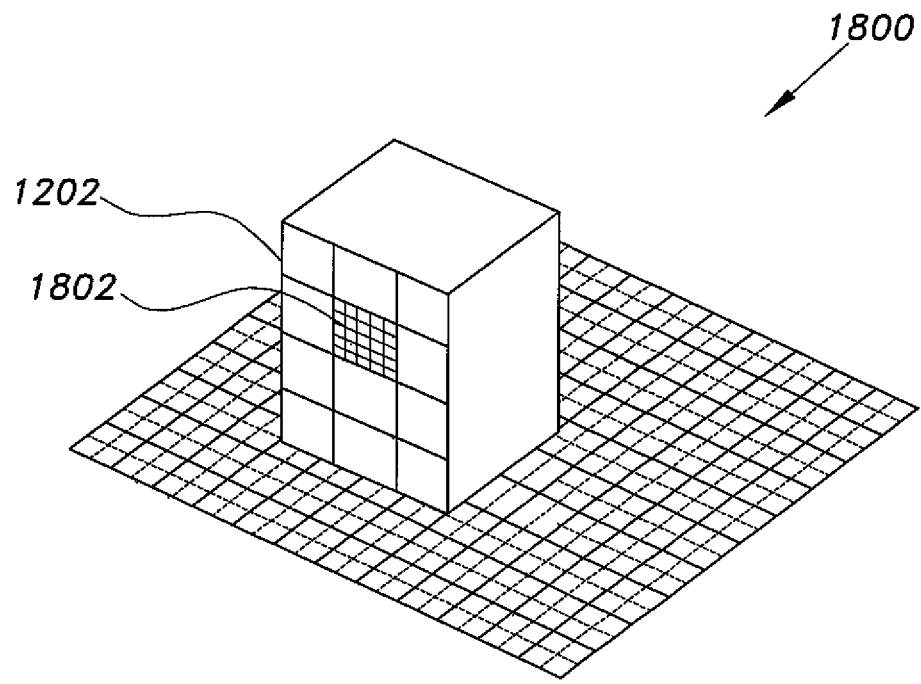
FIG. 18 shows the cube now with a subdivided grid in a 3D modeling user interface method according to the present invention.
Figure 19:
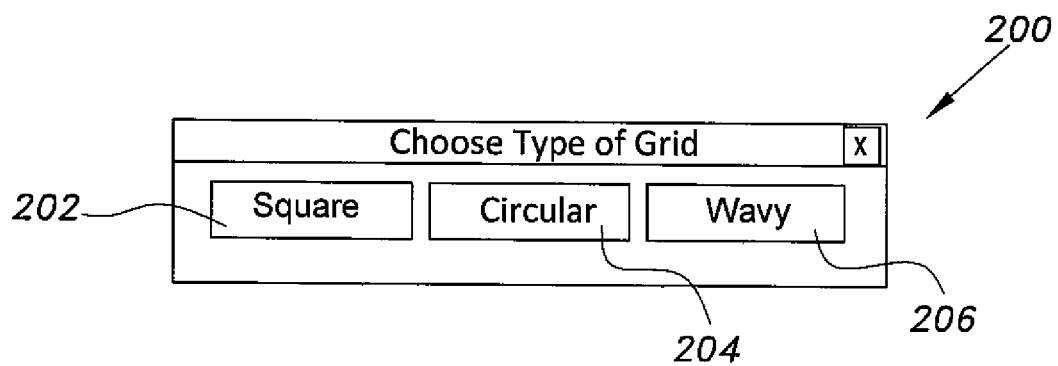
FIG. 19 shows the grid type dialog box, this time the user will select circular type, in a 3D modeling user interface method according to the present invention.
Figure 20:
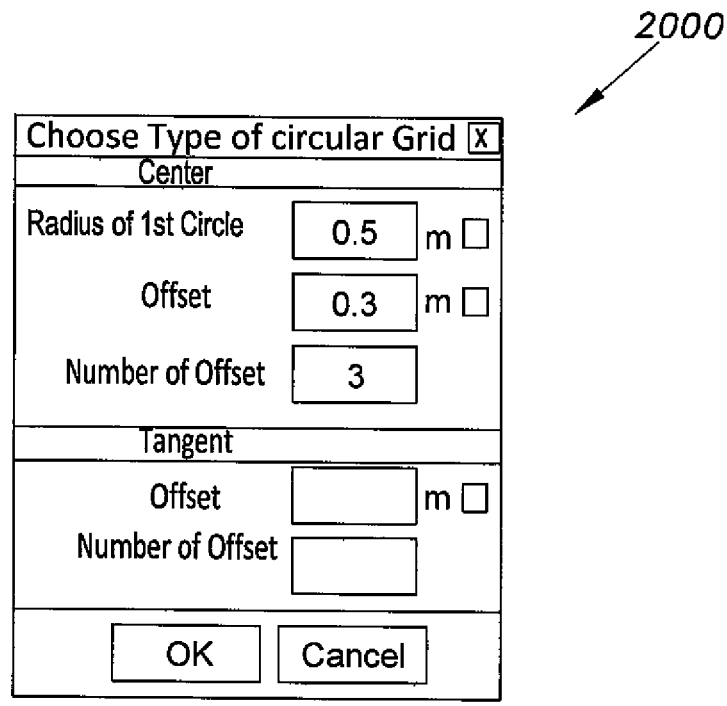
FIG. 20 shows the circular grid parameters entry dialog box in a 3D modeling user interface method according to the present invention.

Moreover, the 3D modeling user interface software provides a method to create a sub-grid surface inside a grid. From the Create 3D list on the GUI control page 100, the user clicks on "Grid on Surface" 108. Then the user left-clicks on the desired sub-surface of the box to initiate the process of grid creation thereon. The 3D modeling user interface software then presents dialogue box 200. It should be understood that at this point there is no dialogue box or the Step for Choosing (Reflected) or (Customized) Grid because the Sub-Surface is already a component from (Grid on Surface) which was created before this step. The user then clicks on Square as the type of grid choice. Responsively, the 3D modeling user interface software presents the Grid on Surface (Square Grid) dialog box 1500, as shown in FIG. 15. If the user enters division values 5 and 5 for Vertical Space (Y) and Horizontal Space (X), instead of the 4 and 3 values already in place, the 3D modeling user interface software will responsively create a 5×5 sub-grid 1802 of grid 1202 on the box surface, as shown in simulated screenshot 1800 in FIG. 18.

Figure 21:
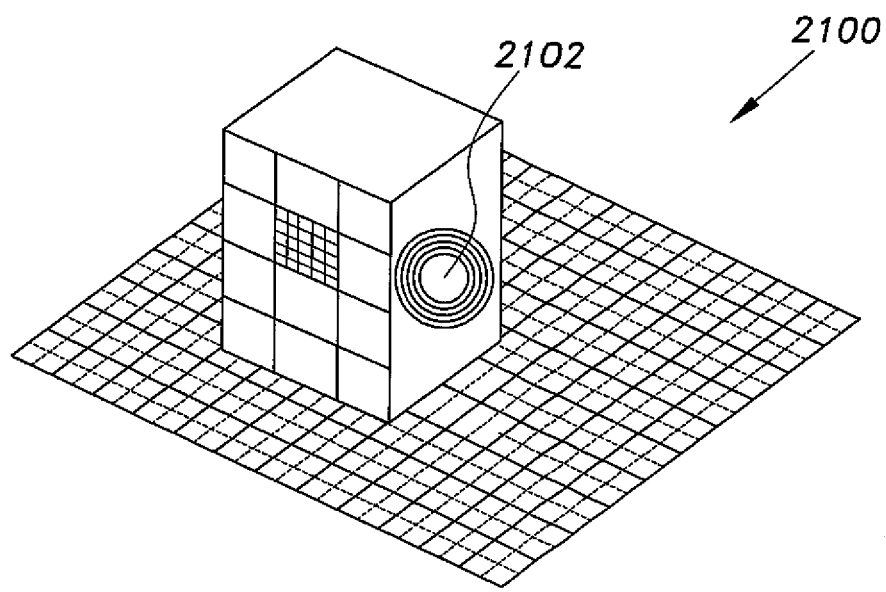
FIG. 21 shows the cube with the circular grid drawn on one of its surfaces in a 3D modeling user interface method according to the present invention.

Software of the present 3D modeling method allows the user to create a circular "grid", i.e., circular pattern (the pattern lines do not intersect each other), on a surface such as another side of the exemplary box. From the Create 3D list on the GUI control page 100, the user clicks on "Grid on Surface" 108. Then the user left-clicks on the desired surface of the box to initiate the circular pattern creation process. The 3D modeling user interface software then presents dialogue box 200. The user chooses "Circular" 1902 on dialog box 200. The 3D modeling user interface then presents "Choose Type of circular Grid" dialog box 2000 from which a "Center" option or a "Tangent" option can be selected. If the user fills entry fields in the "Center" option then the circular grid will start from the center of a selected surface of the box. If the user fills entry fields in the "Tangent" option then the circular grid will touch parameters lines of selected surface in one point of course for each Line (Tangent). Therefore, in the tangent case, the circular grid may actually form an elliptical grid if the selected surface is rectangular. The difference between both circular grid types is that the "Center Circular Grid" starts from the center of the selected surface and offsets outwardly while the "Tangent Circular Grid" starts from the parameters or edges of the selected surface and offsets inwardly. In the "Center" option, the user populates the "Radius of $1^{St}$ Circle" field with 0.5, the "Offset" filed with 0.3, and the "Number of Offset" field with 3. The Offset is the space between the parameter of the 1st circle and the parameter of the 2nd circle. Thus, the outermost circle will have a radius of 0.5 m, distance between circles will be 0.3 m, and there will be three circles defined within the outer circle. The exemplary circular "grid" 2102 is shown in simulated screenshot 2100 of FIG. 21.

Figure 22:
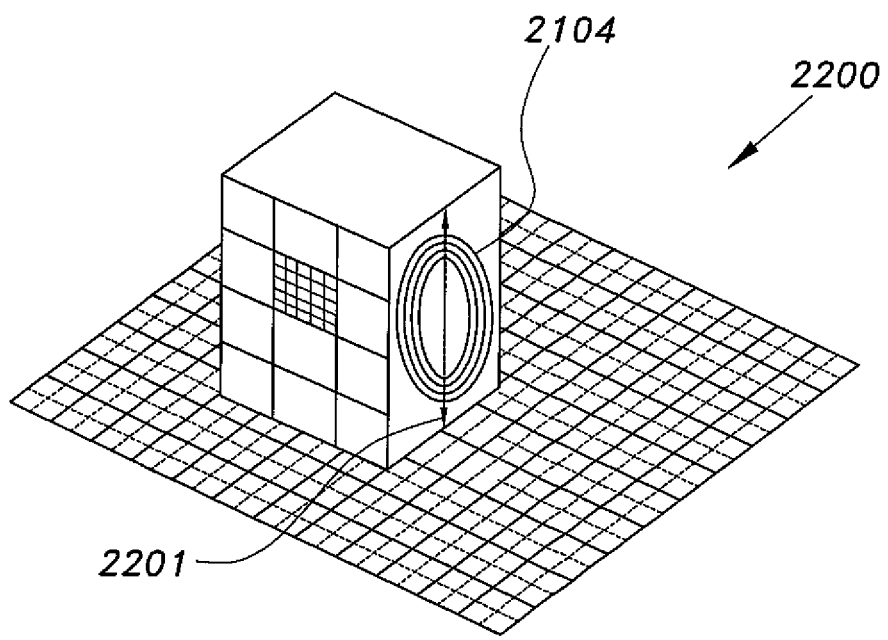
FIG. 22 shows the cube with the circular grid sheared into an elliptical shape per user input in a 3D modeling user interface method according to the present invention.

To modify circular grid surface to be elliptical, the user from the "Selection and Delete" box 101 on the GUI control page 100, clicks on "Del All" and then "Line". Then the user selects the four circles on the side surface of the box in the simulated screenshot 2100 by left-clicking the mouse. Next, on the GUI control page 100, the user clicks on the left-most diamond icon in the "Stretch" box 114. Responsively, the present software provides a double arrowed, substantially vertical axis line 2201 over the now elliptical grid 2104, as shown in FIG. 22.

If the user scrolls the mouse forward, the ellipticals expand. Scroll the mouse backward will shrink the ellipticals. Alternatively, the user can depress the UP keyboard arrow to expand the elliptical grid stretching vertically or the DOWN keyboard arrow "to vertically shrink the ellipticals.

Figure 23:
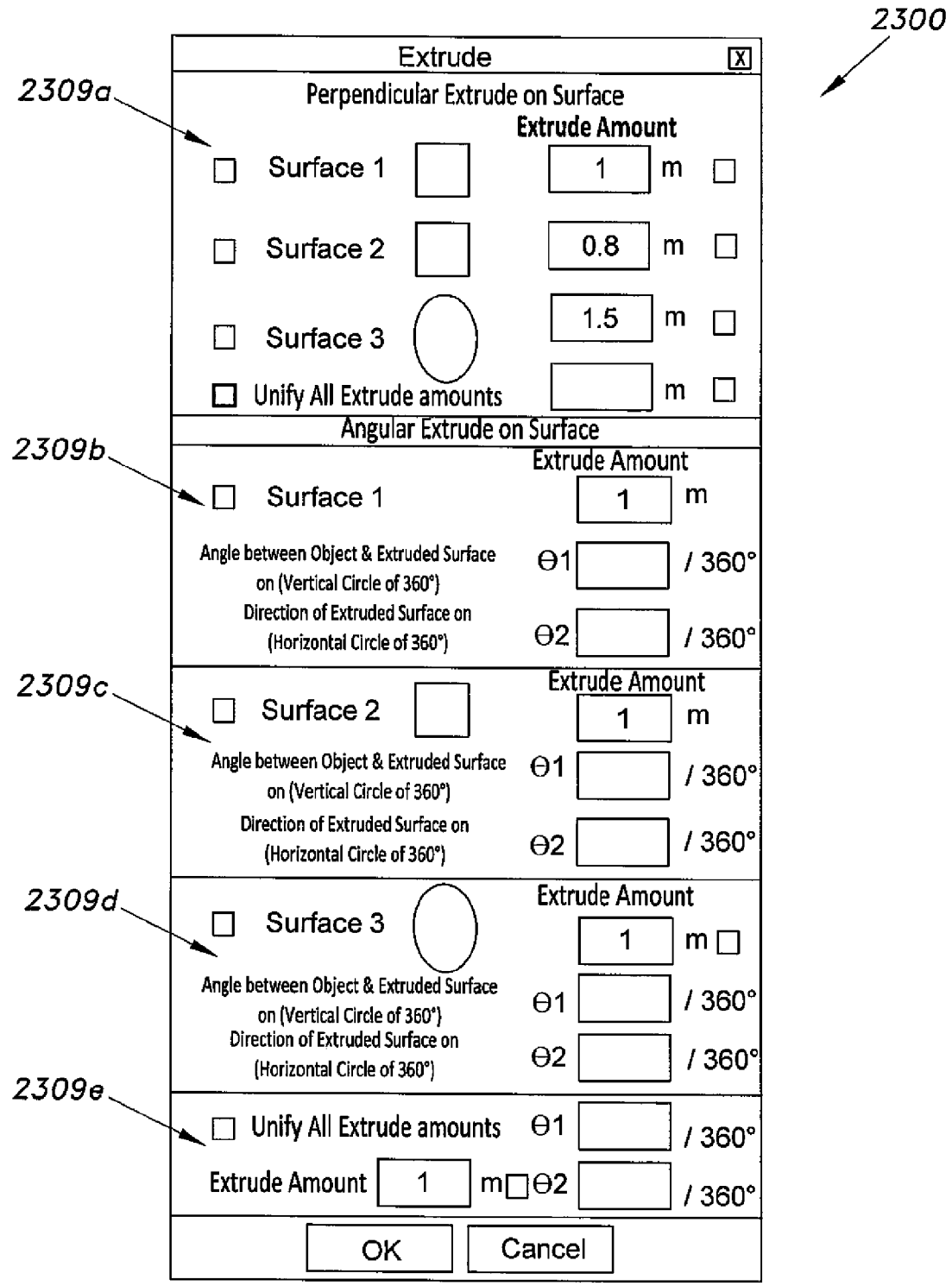
FIG. 23 shows extrusion parameters dialog box for the elliptical grid in a 3D modeling user interface method according to the present invention.
Figure 24:
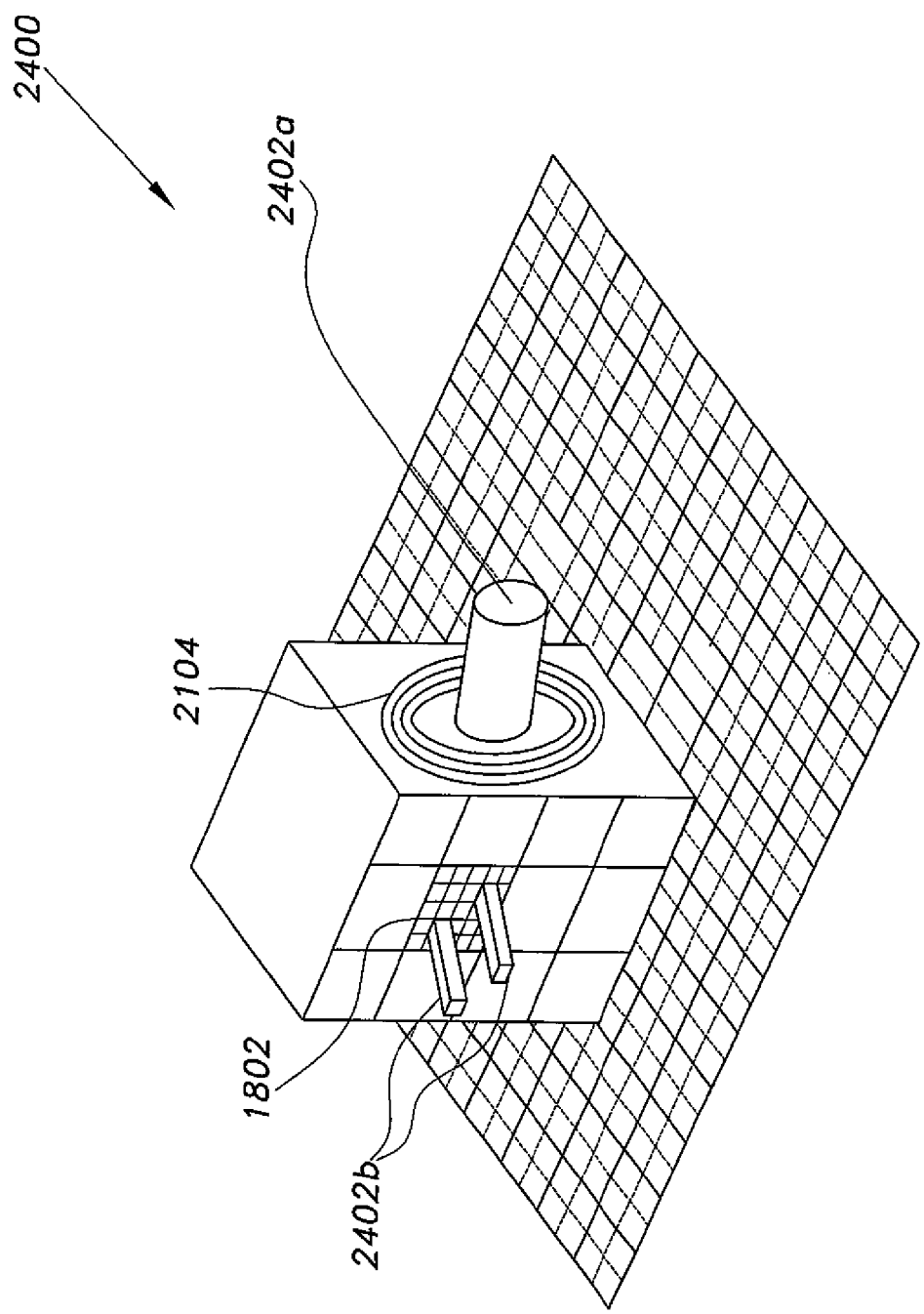
FIG. 24 shows the cube with the ellipse and extruded shape therefrom in a 3D modeling user interface method according to the present invention.
Figure 25:
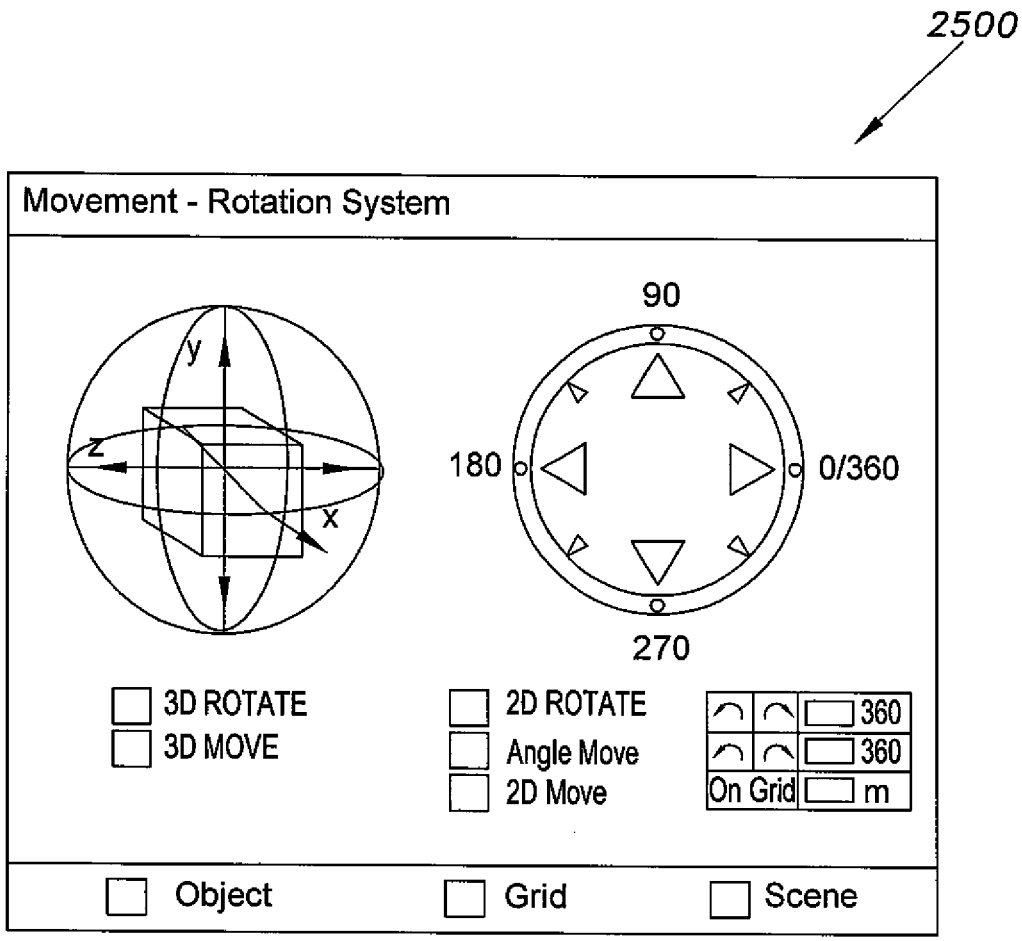
FIG. 25 shows the rotate and move dialog box in a 3D modeling user interface method according to the present invention.

The 3D modeling user interface software allows a user to extrude a 3D object from the elliptical grid and to extrude square cross-sectioned 3D objects (Tiny Squares) from inside the square grid. The user, from the "Selection and Delete" box 101 on the GUI control page 100, clicks on Area. Next, the user selects (via left-clicking) on 2 tiny squares from the square grid and the center of the elliptical on the box displayed in the display area showing the 3D box with grids. The software then presents the surface extrude dialog box 2300. The user then enters the values in the entry fields presented in dialog box areas 2309a, 2309b, 2309c, 2309d, and 2309e, as shown in FIG. 23. To confirm the entries, the user presses OK at the bottom of the dialog box. The present software then renders in screenshot 2400 the extrusions 2402a, 2402b from the ellipticals 2104 and the square grid as shown in FIG. 24.

Figure 26:
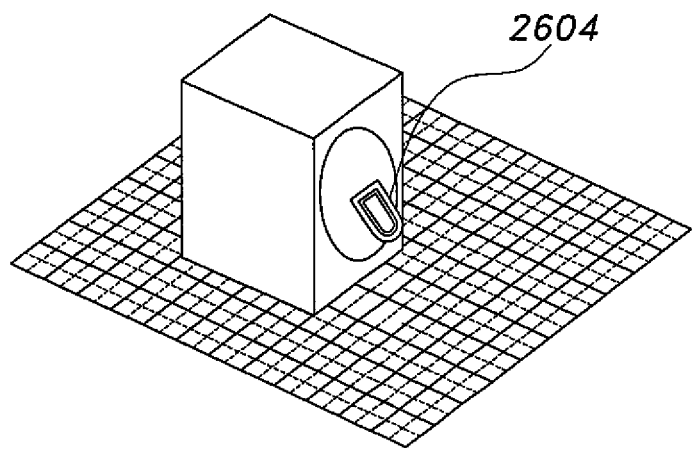
FIG. 26 shows the rotated (pivoted) elliptical extrusion in a 3D modeling user interface method according to the present invention.
Figure 27:
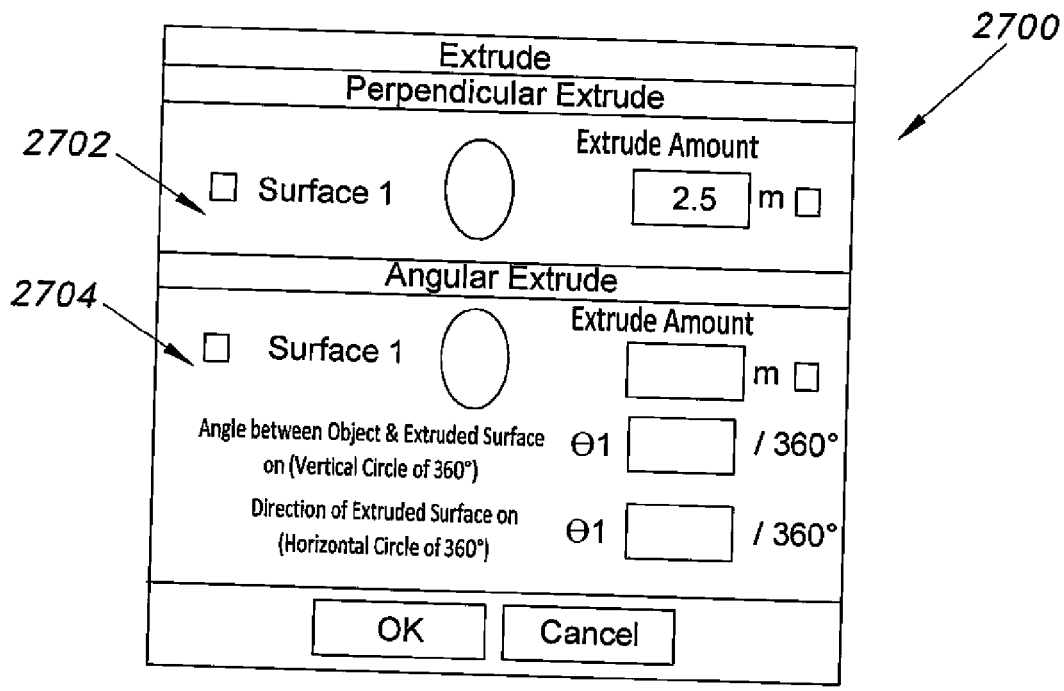
FIG. 27 shows the extrusion dialog box in a 3D modeling user interface method according to the present invention.

The present software also performs grid rotation and extrusion therefrom. The user, from the "Selection and Delete" box 101 on the GUI control page 100, clicks on Area. Next, the user selects (via left-clicking) on 3 ellipticals on the box in the 3D display area. Then on the GUI control page 100, the user clicks on the small sphere in the "3D Move" box 116. The software responds by presenting a virtual gimbal (rotation sphere) on a Movement-Rotation System control screen 2500. The axis inside the virtual gimbal can be manipulated with the mouse to rotate an object, a grid, or a scene shown in the 3D display screen. In the exemplary case, the user chooses X Axis on the right-hand side of the Degree/Direction (X-Y-Z) sphere and drags the Arch Tangent towards the desired Degree/Direction. Alternatively, the user enters the Degree of Rotation in the lower right hand entry fields. The exemplary rotated elliptical section 2604 is shown in the simulated screenshot 2600 of FIG. 26.

If the user creates a circular grid or (elliptical one) on a box surface and then selects on the elliptical/circular areas, the software will create new elliptical/circular surfaces that are touched typically with a first box surface. These Elliptical/Circular Surfaces can then be moved or rotated anywhere on the 3D display area screen.

Figure 28:
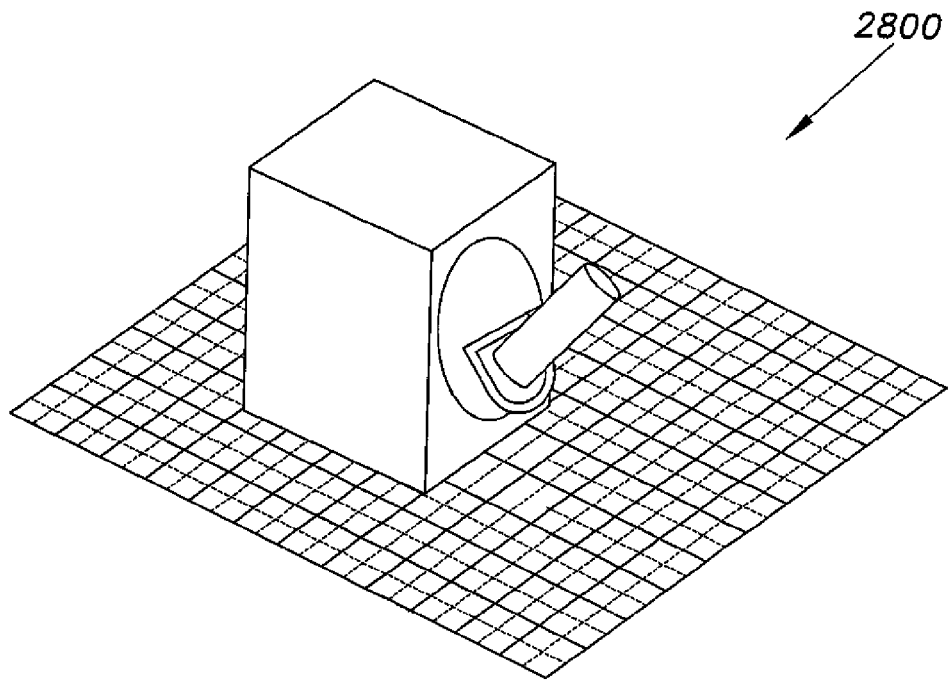
FIG. 28 shows the extrusion rotated ellipse on the cube in a 3D modeling user interface method according to the present invention.
Figure 29:
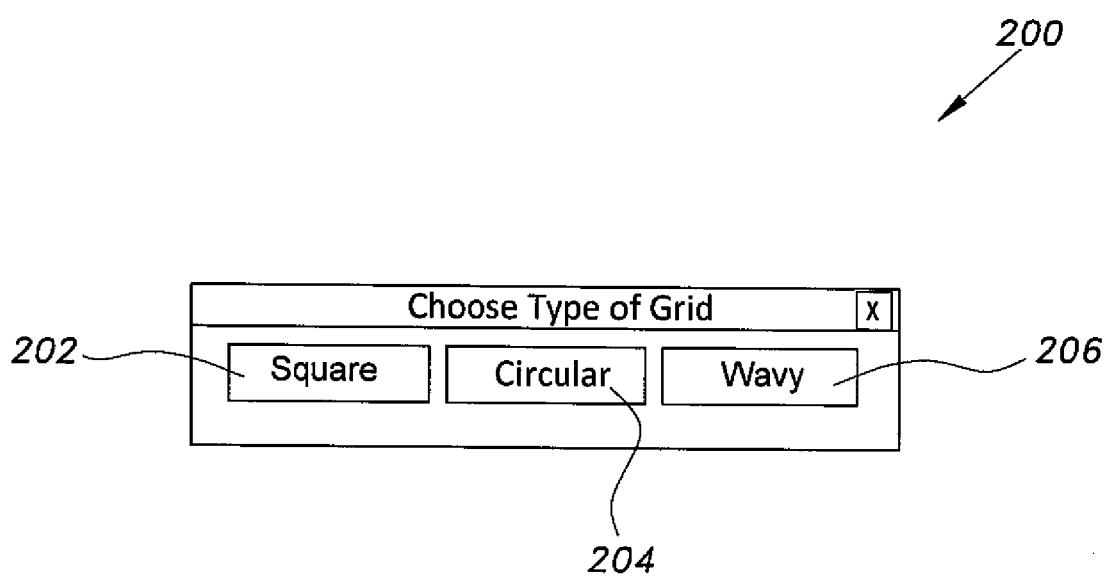
FIG. 29 shows the grid type dialog box the user will select wavy grid in a 3D modeling user interface method according to the present invention.

To extrude from the rotated elliptical section, the user from the "Selection and Delete" box 101 on the GUI control page 100, clicks on Area. Next, the user left-clicks on the displayed elliptical section's center. Responsively the software presents elliptical extrude dialog box 2700. The user then enters 2.5 m as an amount of Extrusion in Perpendicular Option 2702 while leaving angular option 2704 blank. Pressing OK confirms and the software responds by presenting an extrusion from the rotated elliptical as shown in simulated screenshot 2800 of FIG. 28.

Figure 30:
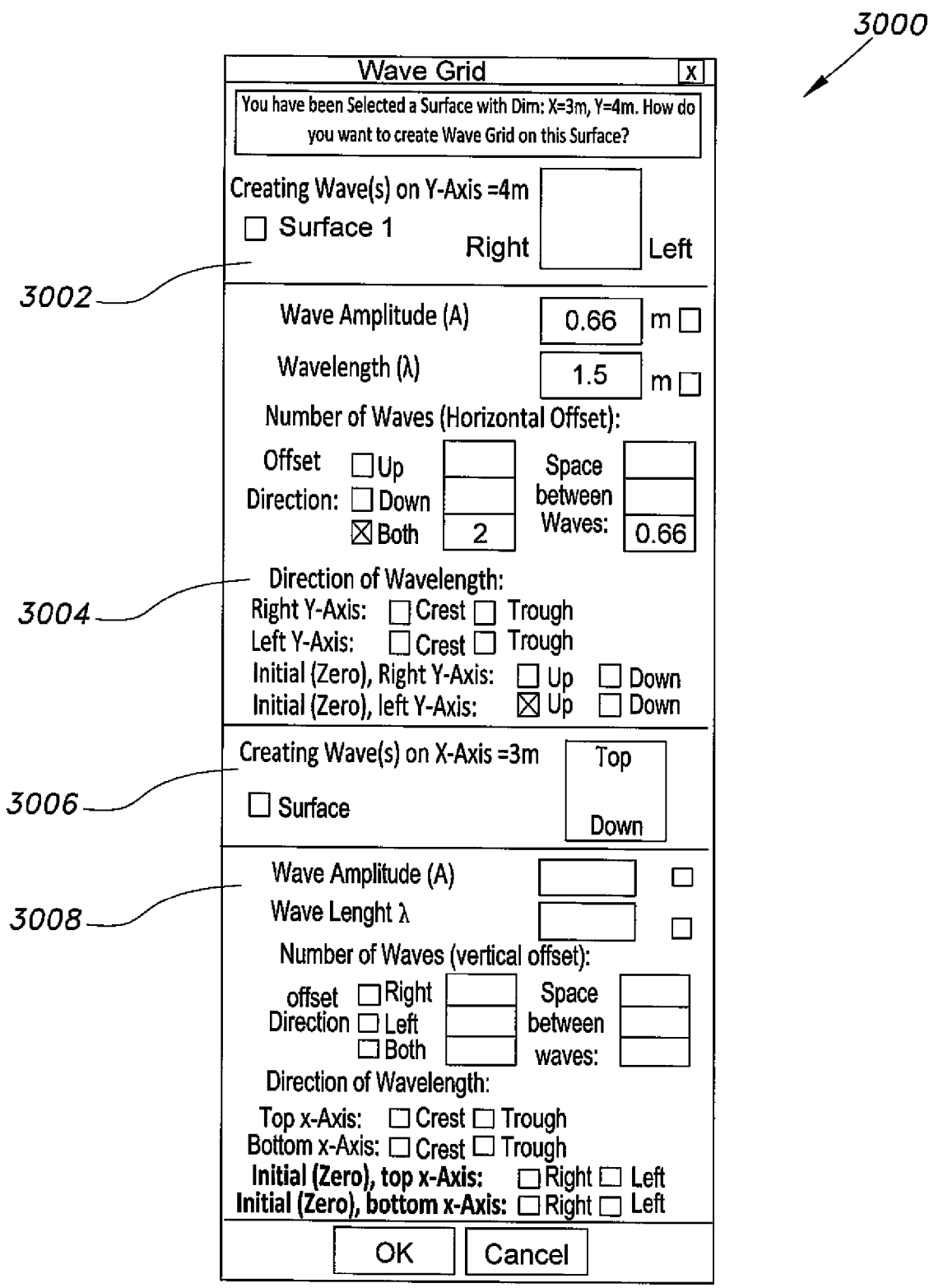
FIG. 30 shows the wave grid parameters dialog box in a 3D modeling user interface method according to the present invention.
Figure 32:
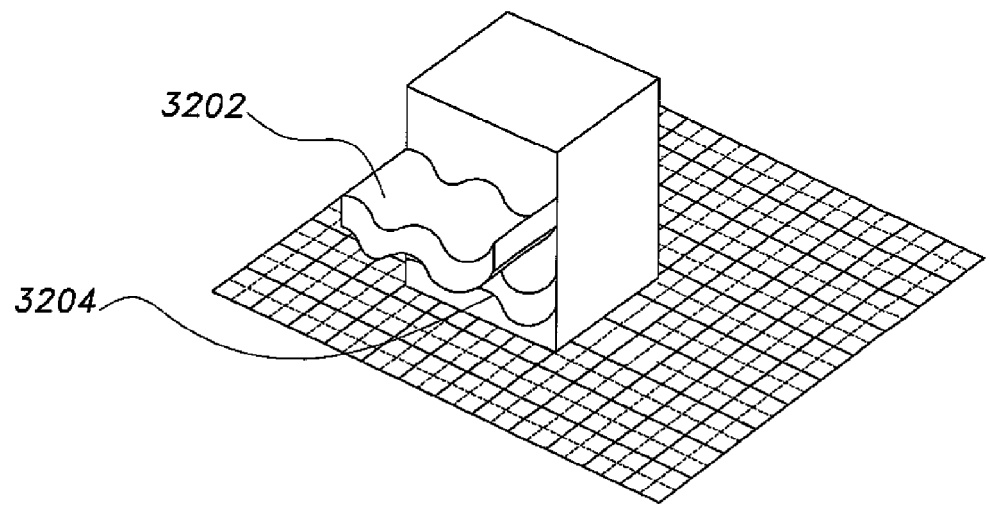
FIG. 32 shows the wavy grid extrusion drawn on the cube in a 3D modeling user interface method according to the present invention.

The user may initiate creation of a wavy grid extrusion by clicking on "Grid on Surface" 108 on the GUI control page 100. In the 3D display of the box the user selects the desired box surface. The software then presents Dialogue Box 200 from which the user can choose wavy grid by selecting the wavy button 206. The software then presents wave grid dialog box 3000 (FIG. 30) which includes surface parameters entry area 3002, horizontal wave parameters entry area 3004, wave axis parameter specification area 3006, and vertical wave parameters entry area 3008. In the exemplary case, the user enters Wave Values on Y-Axis as shown in FIG. 30; Wave Amplitude=0.66 m, Wavelength=1.5 m, Number of Waves=2, Offset Direction: Both (Up and Down), Space between Waves=0.66 m, Direction of Wavelength: Starts from Zero to Up/Crest on Left-Y-Axis. Pressing OK confirms and the software responds by creating a wave grid, i.e., pattern of wavy lines, on the box surface. Simulated screenshot 3200 shows in FIG. 32 that portions 3202 of wave grid 3204 can be extruded.

Figure 33:
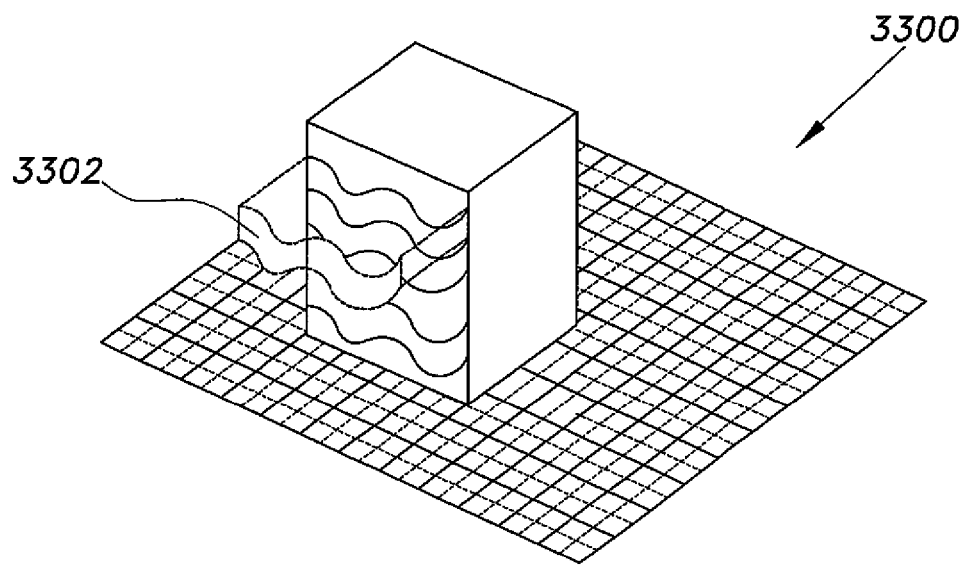
FIG. 33 shows the moved wavy polygon in a 3D modeling user interface method according to the present invention.

The translated, i.e., moved, wave grid 3202 as shown in screenshot 3300 of FIG. 33 is produced as follows. From the "Selection and Delete" box 101 on the GUI control page 100, the user clicks on "Area". Next the user left-clicks on the surface that the user wants to move. The software then presents the Movement-Rotation System dialog box 2500 on which the user clicks on the small sphere.

The user then has the (X-Y-Z) sphere to assist in Rotation/Movement to any Direction. By left-click of the mouse, the user holds on Z Axis in (X-Y-Z) Sphere. Alternatively, the user enters a value in the left corner of the dialog box 2500 to move the selected surface on the Z Axis accurately.

Figure 31:
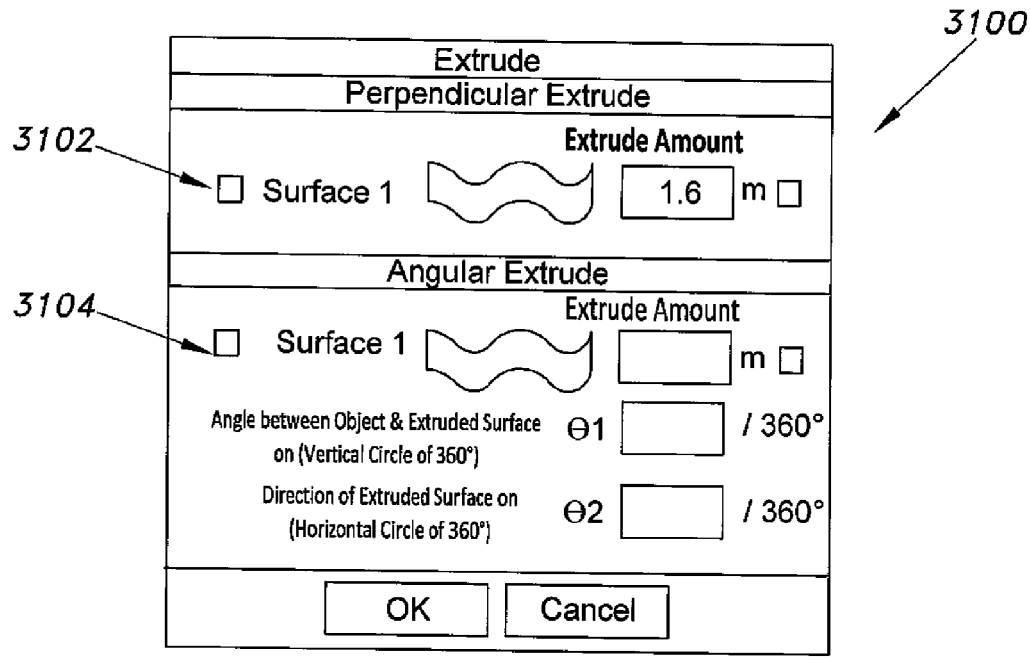
FIG. 31 shows the wavy grid extrusion dialog box in a 3D modeling user interface method according to the present invention.

To commence the wavy grid extrusion process the user clicks on "Area" in the "Selection and Delete" box 101 on the GUI control page 100. The user then left-clicks on the desired extrusion surface. In the Create 3D list on the left hand side of the GUI control page 100, the user clicks on the "Extrude" command. The software then presents the wavy grid extrusion dialog box 3100 (shown in FIG. 31). The wavy grid extrusion dialog box 3100 has a perpendicular extrude option 3102 and an angular extrusion option 3104. In the exemplary case, the user fills the extrude amount field in the perpendicular extrude option 3102 with a value of 1.6, as shown in FIG. 31. Responsively, the software processes the extrusion command and displays the extrusion portion 3202 of wave group 3204, as shown in the simulated screenshot 3200 of FIG. 32.

Figure 34:
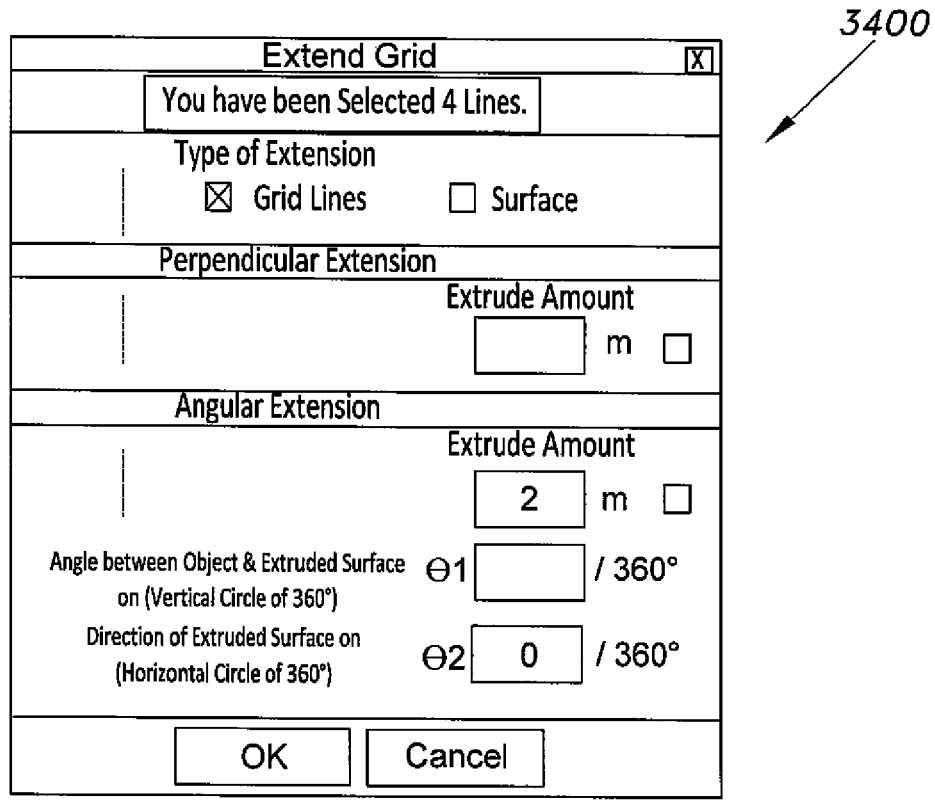
FIG. 34 shows the grid extension dialog box in a 3D modeling user interface method according to the present invention.
Figures 35, 36:
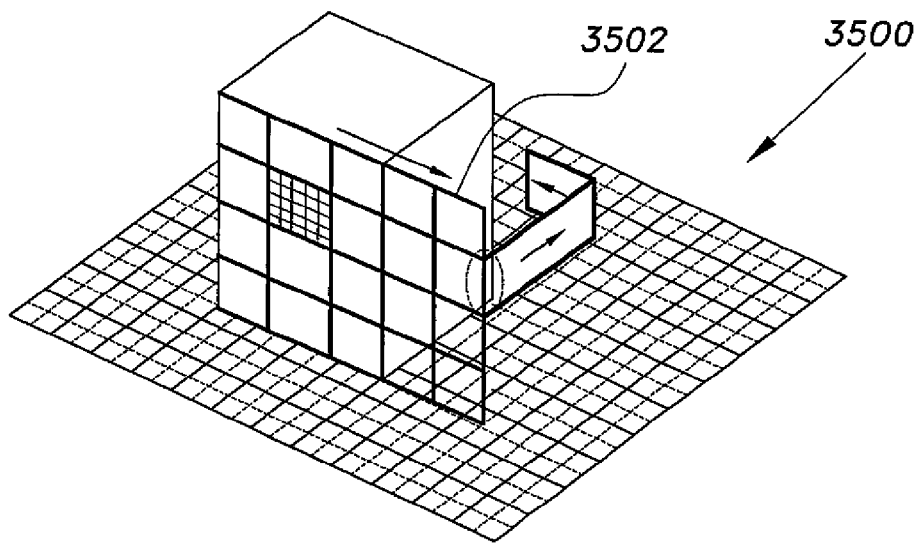
FIG. 35 shows the extended grid extending from the cube in a 3D modeling user interface method according to the present invention.
FIG. 36 shows the square grid parameters dialog box with user drawn curves according to the present invention.

To commence grid extending process the user clicks on "Line" in the "Selection and Delete" box 101 on the GUI control page 100. The user then selects each line on the edge of the displayed box shown in FIG. 35. Each line will extend (in the direction of the arrow) as a row of the original grid surface. Next, from the 2D Sketch list of the GUI control page 100, the user clicks on "Extend Grid" 110. Responsively, the software presents extend grid dialog box 3400, as shown in FIG. 34. The user then checks "Grid Lines" as the type of extension, enters 2 in the angular extension extrude amount field. The θ1 angle field is left blank and θ2 angle field is populated with 0.

Bending the grid extension is done by repeating the extension steps above, except that in the extend grid dialog box 3400, the value of 3 is entered as the extruded amount and θ1 is populated with 90°. This produces the first 90° bend of the grid seen in the simulated screenshot 3500. If you enter −3, the extruded surface will extend in the opposite direction. The bend angle would then be θ1=270°.

Figure 37:
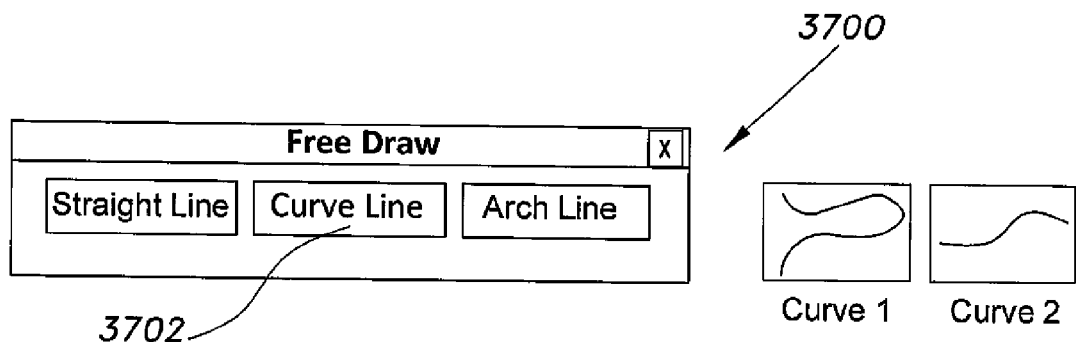
FIG. 37 shows the free draw dialog box in a 3D modeling user interface method according to the present invention.

The 3D modeling user interface software method also performs bending, curving and rolling grid operations. For bending a grid, from the 2D Sketch list of the GUI control page 100, the user clicks on "2D Grid" 106. Responsively, the software presents Square Grid dialog box 300. The user populates the X and Y Module Dims fields 302 with 1 and 1, respectively. The user populates the X and Y Coordinator fields 304 with 100 and 10, respectively. The user populates the X and Y Number of Division fields 306 with 2 and 2, respectively. For all of the aforementioned field blocks, the Fixed Values (X=Y) checkboxes are checked. Next, from the 2D Sketch list of the GUI control page 100, the user clicks on "Free Draw" 192 (the pencil icon). Responsively, the software presents a "Free Draw" dialog box 3700, as shown in FIG. 37. The user then clicks on "Curve Line" 3702 to initiate the drawing of two splines labeled as Curve 1 and Curve 2, respectively.

Figure 38:
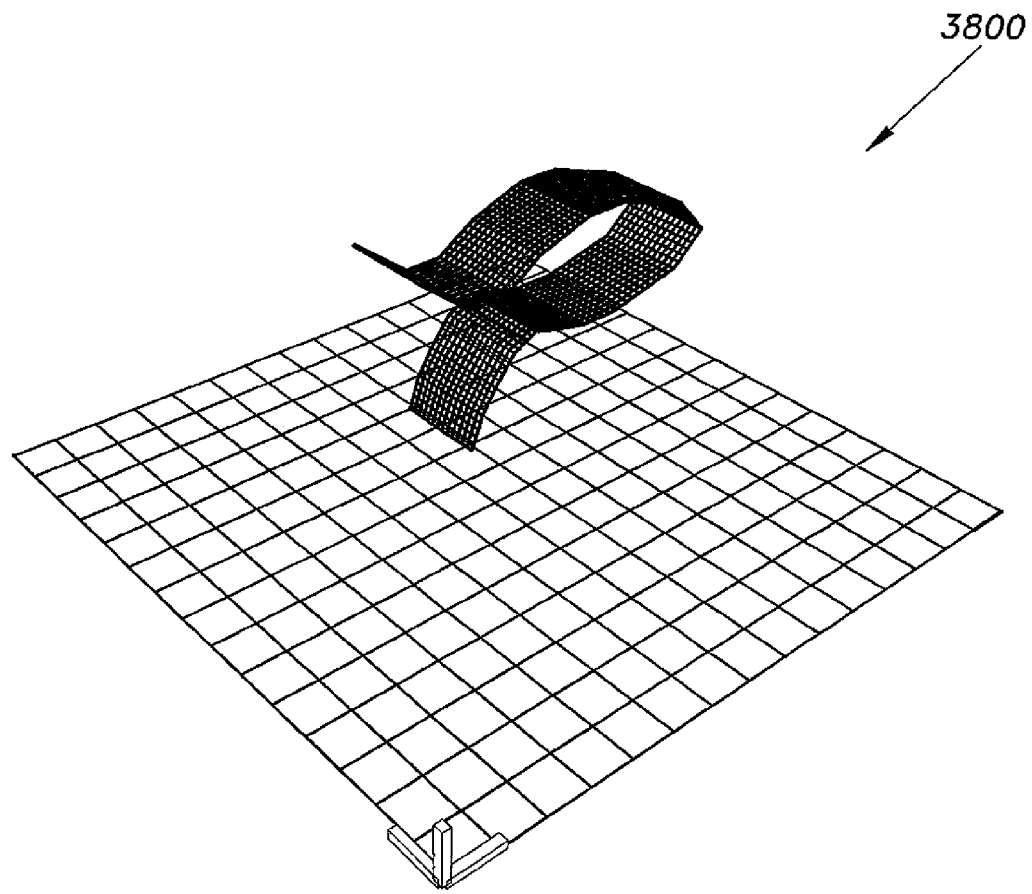
FIG. 38 shows the display of the freely drawn and bended grid in a 3D modeling user interface method according to the present invention.

From the "Selection and Delete" box 101 on the GUI control page 100, the user clicks on "Line" then selects the first spline (Curve 1) by left-clicking. In the 2D list on GUI control page 100, the user clicks on "Line to Grid" command 190. The software responsively applies the curve shape on a square grid and displays the grid which follows the curving pattern of Curve 1, as shown in simulated screenshot 3800 of FIG. 38.

Figure 39:
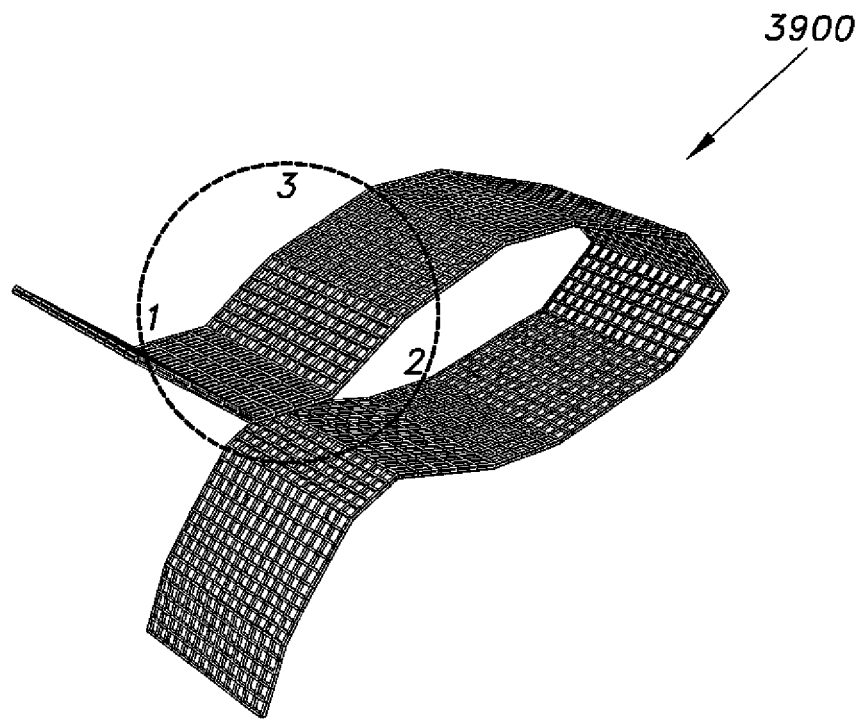
FIG. 39 shows the display of the freely drawn and bended grid and selection for extrusion in a 3D modeling user interface method according to the present invention.

Next, from the "Selection and Delete" box 101 on the GUI control page 100, the user clicks on "Area", then by Left-Clicking, the user selects on any 3 (Grid Modules) on the Area as shown in 3900 of FIG. 39. On the GUI control page 100 the user then clicks on "Extrude" command 104 from the 3D list. The Scene Extrude dialog box 4000 responsively appears.

The concept of the Scene Extrude option is that all Drawings are collected in the X-Y-Z Scene Box which is virtual/hidden. If you select Y-Axis, the extrusion will go directly to Y-Axis which is Vertical Axis. The Surface of Extrusion can be in any position or angle, because the extruded object will go directly to X-Y-Z Axis.

Figure 40:
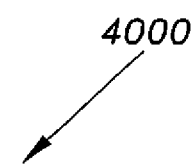
FIG. 40 shows the scene extrude parameters dialog box in a 3D modeling user interface method according to the present invention.
Figure 41:
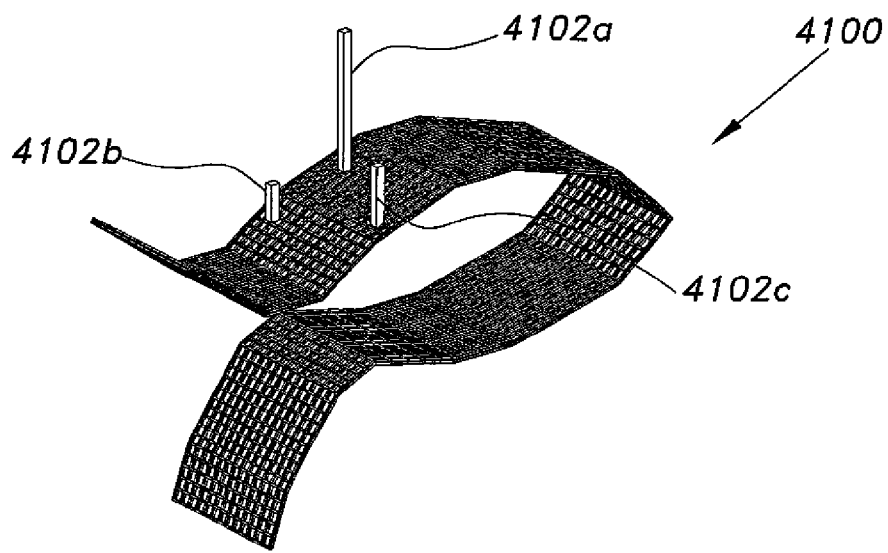
FIG. 41 shows the display of the extrusions extending from the freely drawn and bended grid in a 3D modeling user interface method according to the present invention.
Figure 42:
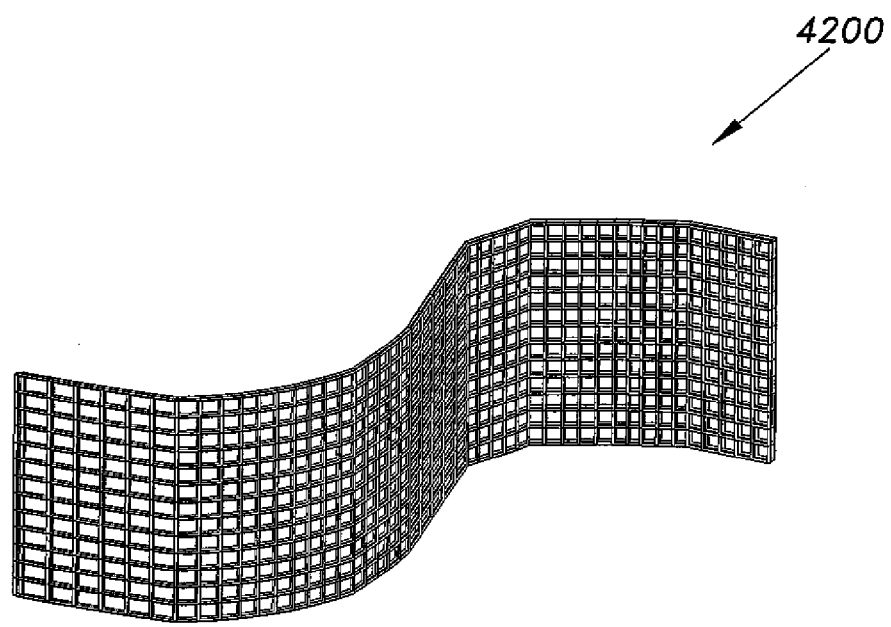
FIG. 42 shows the display of a rotation of a freely drawn and bended grid in a 3D modeling user interface method according to the present invention.

The user then enters In Y-Axis, values 2.5, 3 and 6 for each Grid Module as shown in FIG. 40. The software responsively creates the extrusions 4102a, 4102b, and 4102c, as shown in screenshot 4100 of FIG. 41.

If the preceding bending grid extrusion steps are repeated with Curve 2 except for a different Square Grid entry selection of Number of Modules in X-Coordinator to be 50 and Y to be 10. The user then picks only on two Grid Modules randomly in the middle of the square grid.

Figure 43:
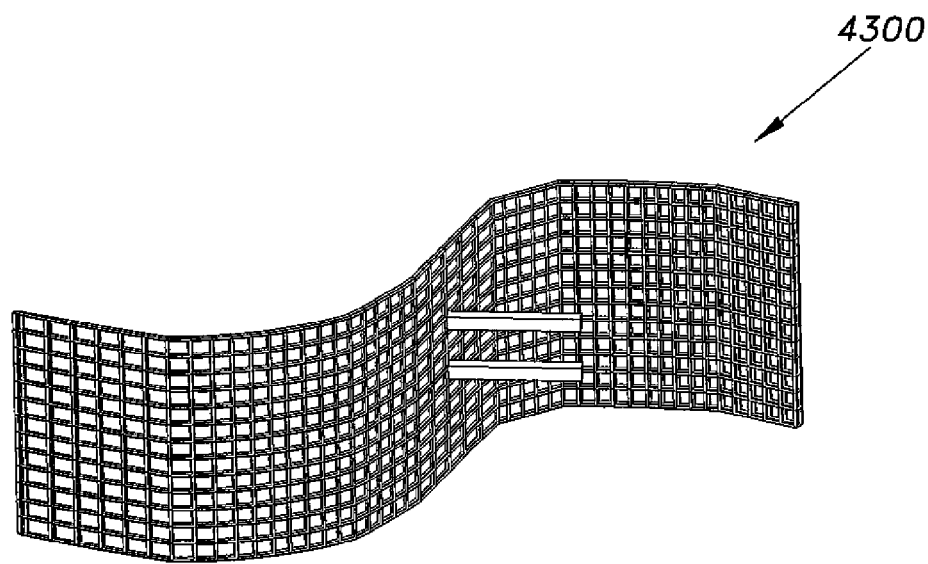
FIG. 43 shows the display of the rotated freely drawn and bended grid with extrusions in a 3D modeling user interface method according to the present invention.

The grid can then be rotated by using the Movement-Rotation System control screen 2500 dialog box. On (X-Y-Z) Sphere the user selects by left-click on Parameter Tangent of the Circle then pulls the mouse toward X-Axis to Rotate 90° or clicks on X-Axis and enters 90° 1360°. When the user clicks on Extrude command from the 3D list on the left hand side of the GUI control page 100, the Scene Extrude dialog box 4000 again appears. This time the user enters 7 as an amount of Extrusion for both (Grid Modules) then ticks on X-Axis and presses OK. The software then creates the extrusions as shown in simulated screenshot 4300 of FIG. 43.

Figure 44:
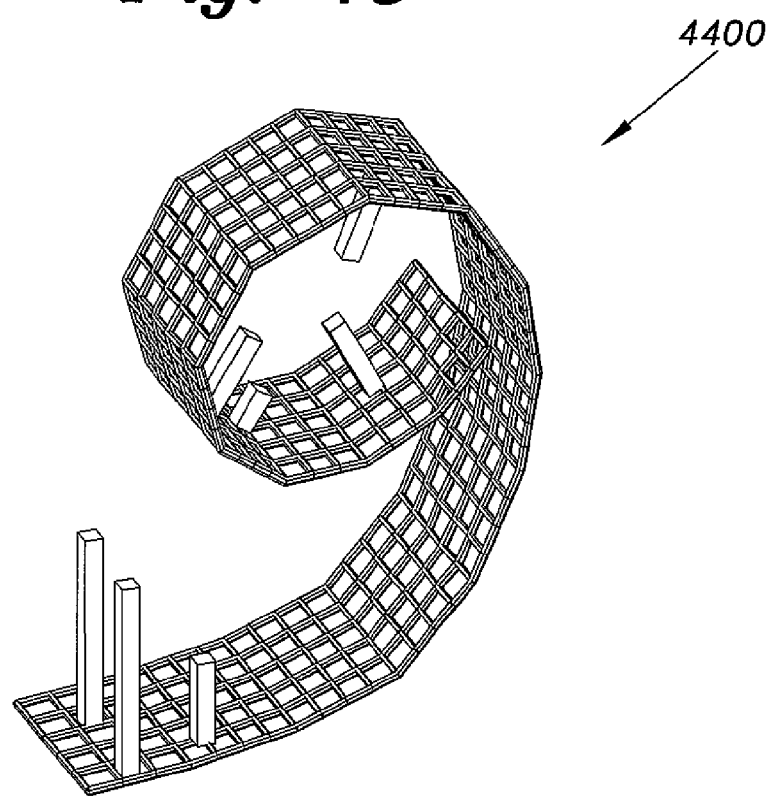
FIG. 44 shows the display of the rotated freely drawn and bended grid with extrusions rolled into itself in a 3D modeling user interface method according to the present invention.

The rolling grid shown in simulated screenshot 4400 of FIG. 44, is created in the same manner as the two previous examples except for the shape of the curve drawn in the free draw step, and the fact that perpendicular extrude is selected in the extrude dialog box 4000.

Figures 45, 46:
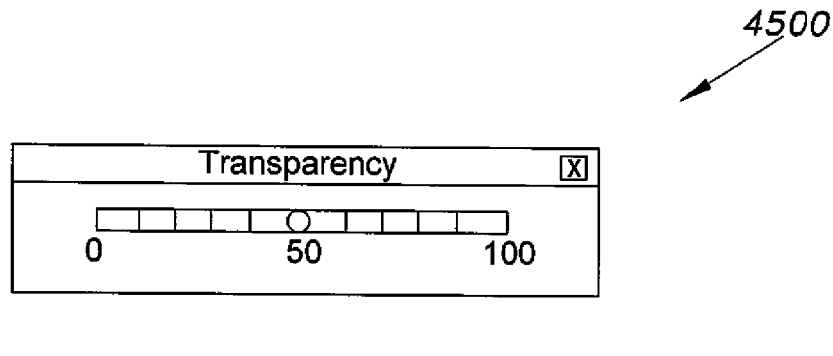
FIG. 45 shows the transparency selection slider control in a 3D modeling user interface method according to the present invention.
FIG. 46 shows the square grid dialog box in a 3D modeling user interface method according to the present invention.
Figure 47:
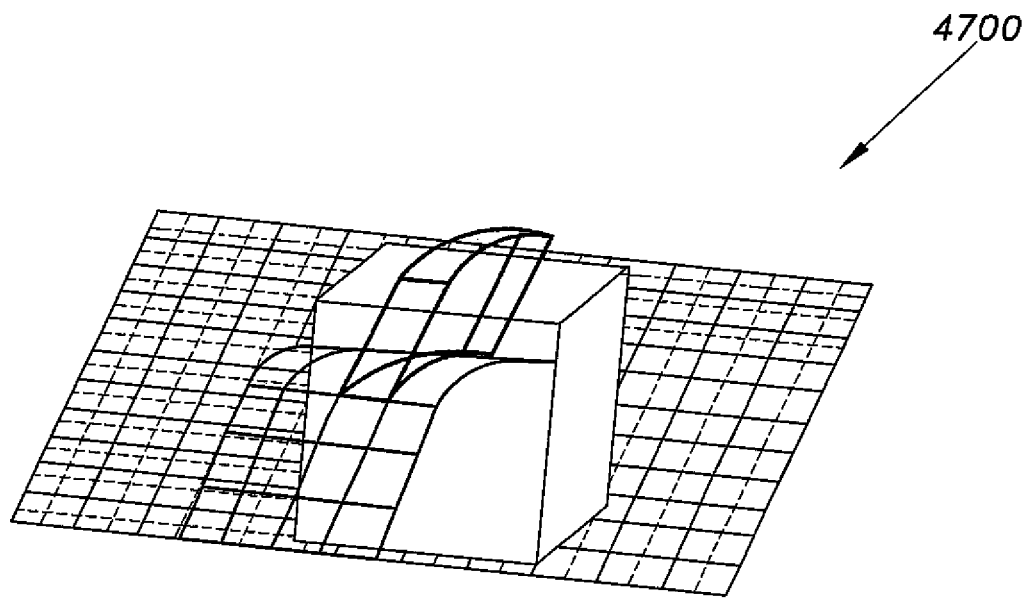
FIG. 47 shows the display of cube with inserted grid and extrusion in a 3D modeling user interface method according to the present invention.

The 3D modeling user interface software allows for applying a variety of grid curving transformations to create 3D objects, such as the box shown in simulated screenshot 4700 of FIG. 47. The user can create a box from a square grid as in the box shown in simulated screenshot 900 of FIG. 9. Then, from the "Selection and Delete" box 101 on the GUI control page 100, the user clicks on "Form". Next, from the "Scale and Color" box 112 the user clicks on "Trans". Responsively the software presents a transparency degree dialog strip 4500 from which the user can select a desired opacity of the displayed object (box). In this example the user selects 50% transparency. After the box is made transparent, the user creates a new square grid using the parameters displayed in FIG. 46.

The user clicks on the "free draw" icon 192 on the GUI control page 100 and then draws a curve similar to Curve 2 shown in FIG. 37. Then, in the "Selection and Delete" box 101 on the GUI control page 100, the user chooses "Line", then left-clicks on the curve to select it. In the 2D list, the user clicks on the "Line to Grid" command 190 which results in the software applying the curve shape on the square grid. Using the mouse, the user moves a desired portion of the curved grid inside the transparent box. Next, from the "Selection and Delete" box 101 on the GUI control page 100, the user clicks on Area and then selects a desired grid module (atom) on the grid. Using the aforementioned extrusion techniques the grid module is extruded through the box according to user specification.

Figure 48:
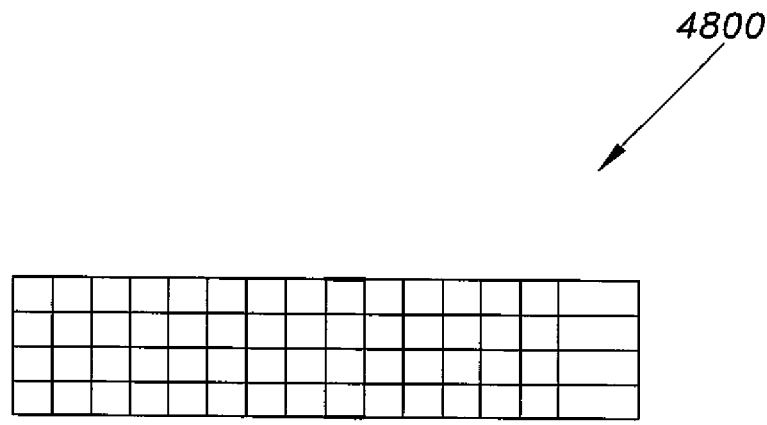
FIG. 48 shows the display of a rectangular grid in a 3D modeling user interface method according to the present invention.
Figure 49:
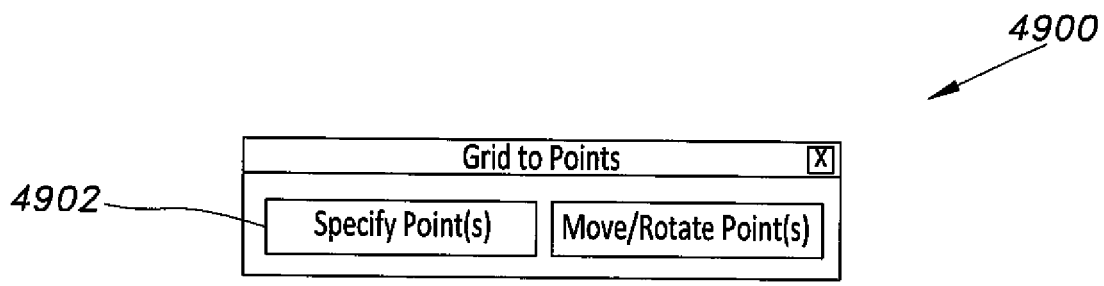
FIG. 49 shows the grid to points dialog box in a 3D modeling user interface method according to the present invention.
Figure 50:
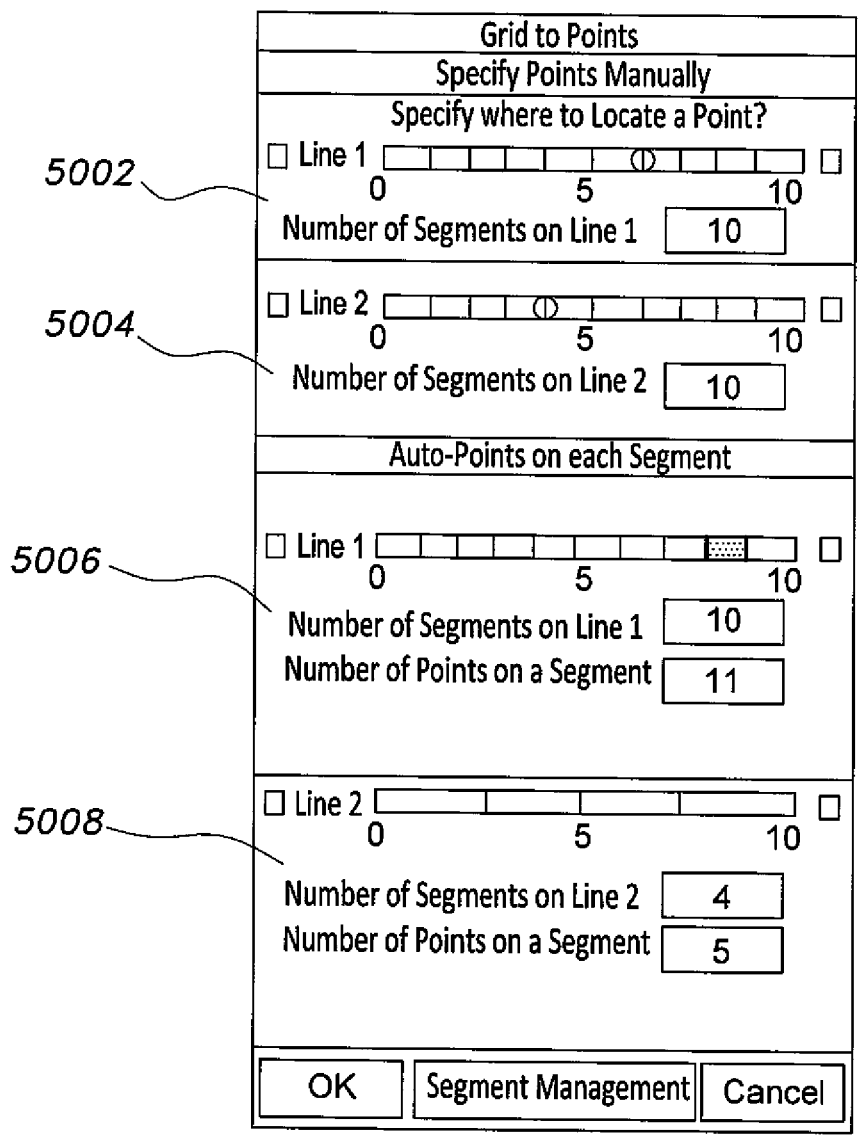
FIG. 50 shows the grid to points parameters dialog box in a 3D modeling user interface method according to the present invention.
Figure 51:
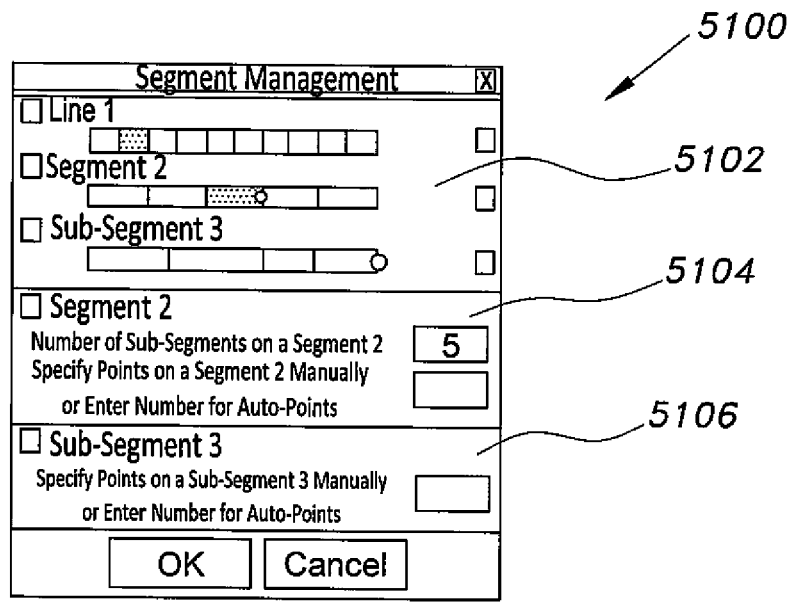
FIG. 51 shows the segment management dialog box in a 3D modeling user interface method according to the present invention.
Figure 52:
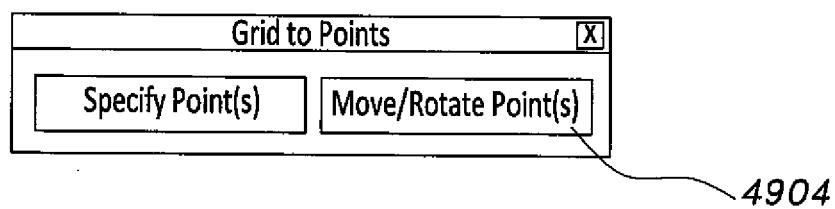
FIG. 52 shows the grid to points dialog box in a 3D modeling user interface method according to the present invention.
Figure 53:
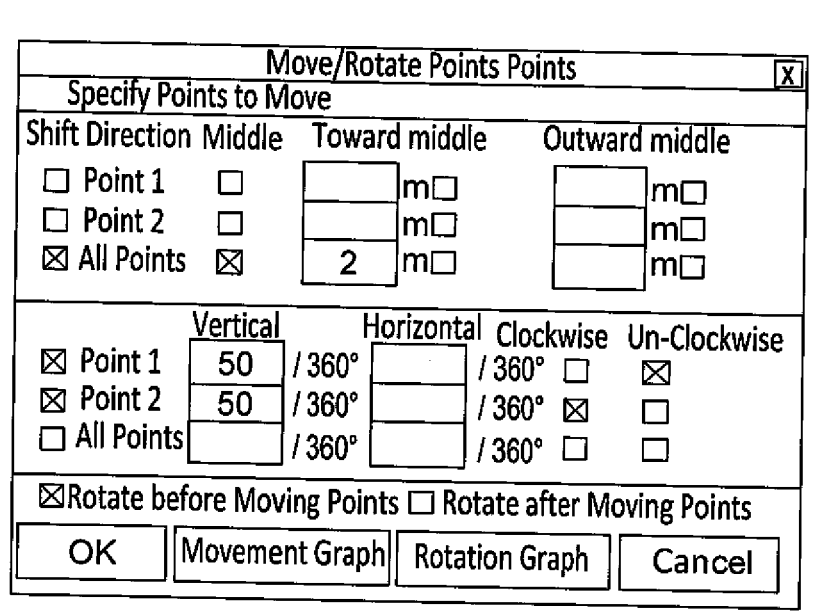
FIG. 53 shows the move-rotate points dialog box in a 3D modeling user interface method according to the present invention.

The 3D modeling user interface software can also perform grid distortion according to commands from the user. As an example of grid distortion, the user can create a square grid, with X=Y=1 m as grid modules (atoms). The user then makes Number of Grid Modules in X-Coordinator=16 and Y-Coordinator=4. No sub-grid is created. From the "Selection and Delete" box 101 on the GUI control page 100, the user clicks on "Points". Points mathematically can be found in the intersection of two lines. Alternatively, "Grid to Points" 197 is selected, and responsively the software assists creation of points on Lines/Segments of the grid or independent lines/segments. This gives the user the capability to easily control by use of the stretch command in box 114 of the GUI control page 100 to pull/stretch points to reshape the lines/segments. Moreover, the "Grid to Points" command 197 can be applied on parameters of circles, arches and curves. Thusly, the user selects on two lines/segments on edges of square grid 4800 shown in FIG. 48. Then the user clicks on "Grid to Points" 197. The software responds by presenting "Grid to Points" dialog box 4900. The user then chooses "Specify Points" 4902. This user action causes the software to open a "Grid to Points" dialog box 5000. Manual point location specification can be entered in a Line 1 Point Specification dialog 5002 and a Line 2 Point Specification dialog 5004. Line 1 Auto-Points dialog area 5006 and Line 2 Auto-Points dialog are 5008 are not used in this example and thus their values are grayed out. Each point specification dialog area has a segment bar on which, in the manual case, the user can specify points. The user specifies the points in dialog areas 5002 and 5004 by entering 10 for the Number of Segments on Line 1 and also on Line 2. The user then left-clicks on one of the thin black line in the segment bar to specify a desired point on the line. The user clicks OK to confirm/commit the selection. The user clicks again on "Grid to Points", this time selecting "Move/Rotate Point(s)" 4904 as shown in FIG. 52. The software responsively presents the "Move/Rotate Point(s)" dialog box 5300, as shown in FIG. 53. The user populates the desired fields in the "Specify Points to Move dialog area" as follows. The user checks "All Points" for Shift Direction, "All Points" for Middle, and the amount of 2 m in the Toward middle entry field. In the "Specify Points to Rotate" dialog area the user specifies only Point 1 and Point 2 to rotate 50° out of 360°. The user then specifies Point 1 to rotate counterclockwise, and Point 2 to rotate clockwise. Pressing on OK confirms/commits the commands and the software responds by twisting the grid accordingly as shown (minus the extrusions) in simulated screenshot 5400 of FIG. 54.

An alternative approach to initiating grid distortion manually is specifying Points in the "Select" box 101 of the GUI control page 100, then Using Stretch" box 114, then populating the appropriate fields in the Move/Rotate System dialog box 2500.

Figure 54:
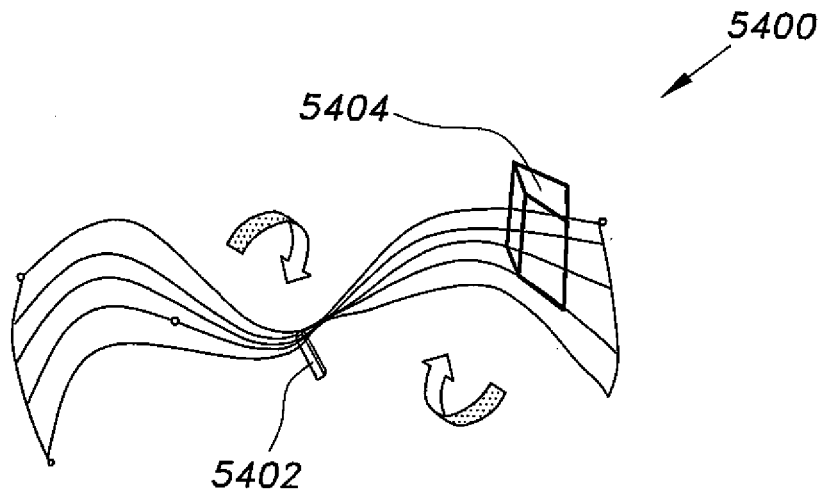
FIG. 54 shows the display of a distorted rectangular grid with distorted extrusions in a 3D modeling user interface method according to the present invention.

The extrusions 5402 and 5404 extending from the distorted, i.e., twisted, grid shown in FIG. 54 are created as follows. The user initiates the distorted grid extrusion by on a by clicking on "Area" from "Select and Delete" box 101 of GUI control page 100. The user then clicks on the "Extrude" command 104. In the Extrude Management dialog box 800 the user enters Enter −1.8 m as a grid perpendicular extrusion amount. The user then clicks OK to confirm/commit the selections. The 3D modeling user interface software responds as shown in FIG. 54 by displaying the extrusions 5402 and 5402 from the specified distorted grid atoms.

It will be understood that the diagrams in the drawings depicting the 3D modeling user interface method are exemplary only, and may be embodied in a dedicated electronic device having a microprocessor, microcontroller, digital signal processor, application specific integrated circuit, field programmable gate array, any combination of the aforementioned devices, or other device that combines the functionality of the 3D modeling user interface method onto a single chip or multiple chips programmed to carry out the method steps described herein, or may be embodied in a general purpose computer having the appropriate peripherals attached thereto and software stored on a non-transitory computer readable media that can be loaded into main memory and executed by a processing unit to carry out the functionality and steps of the 3D modeling user interface method described herein.

Moreover, the UI software may be created on Visual Studio. The UI software may also be delivered as Create Commands/Tools used as add-ons icons on specific existing software such as Sketch-up, AutoCAD, 3D Studio Max, etc. A user would be able to download Commands/Tools from a website. It is contemplated that the UI will run on Windows as well as Mac & Linux platforms. Additionally it is contemplated that the present method can be used with smart Computer Input Devices (3D Mouse, Smart Keyboard) or WACOM devices which assist in us using a PEN stylus to design on a touch screen. The present method may also be compatible with a touchscreen on any desktop or laptop screen. The software implementing the method may be developed as an App on many operating systems, such as APPLE, Android, etc., which provides more opportunities to use the App on a variety of computer devices, such as tablets, notebook, smart-phones, and the like.

It is to be understood that the present invention is not limited to the embodiments described above, but encompasses any and all embodiments within the scope of the following claims.

I claim:

1. A 3D modeling user interface method, comprising the steps of:
   a graphical user interface providing on a computer screen a 2D scalable grid;
   the graphical user interface receiving extrusion instructing inputs from a user;
   the graphical user interface performing extrusion computer graphical operations based on the extrusion instructing inputs;
   the graphical user interface extruding whole multiples of an atomic portion of the grid;
   wherein responsive to user commands the graphical user interface positions the 2D scalable grid on a surface of a displayed object, the extruded atomic grid portion extending from the displayed object surface;
   the graphical user interface presenting the extruded atomic grid portion on the computer screen for viewing and further manipulation by the user;
   the graphical user interface accepting commands from the user to shear user selected portions of the 2D scalable grid;
   the graphical user interface performing shearing computer graphical operations based on the shear commands, the shearing computer graphical operations shearing the user selected portions of the 2D scalable grid;
   the graphical user interface responsively displaying the sheared user selected portions of the 2D scalable grid;
   wherein the graphical user interface displays the extruded atomic grid portion from the selected portions of the 2D scalable grid as a sheared extruded portion thereof, which exhibits transformations formed according to the shearing commands from the user;
   the graphical user interface accepting commands from the user to twist user selected portions of the 2D scalable grid;
   the graphical user interface performing grid twisting computer graphical operations based on the twisting commands, the grid twisting computer graphical operations twisting the user selected portions of the 2D scalable grid;
   the graphical user interface responsively displaying the twisted user selected portions of the 2D scalable grid; and
   wherein the graphical user interface displays the twisted portion from the selected portions of the 2D scalable grid as a twisted extension thereof, which exhibits transformations formed according to the twisting commands from the user;
   the graphical user interface accepting commands from the user to bend user selected portions of the 2D scalable grid;
   the graphical user interface performing grid bending computer graphical operations based on the bending commands, the grid bending computer graphical operations bending the user selected portions of the 2D scalable grid;
   the graphical user interface responsively displaying the bended user selected portions of the 2D scalable grid; and
   wherein the graphical user interface displays the bended portion from the selected portions of the 2D scalable grid as a bended portion thereof, which exhibits transformations formed according to the bending commands from the user;
   whereby each of the exhibited transformations cooperatively represent a 3D modeling.

2. A computer software product, comprising a non-transitory medium readable by a processor, the non-transitory medium having stored thereon a set of instructions implementing a 3D modeling user interface method, the set of instructions consisting of:
   a first sequence of instructions which, when executed by the processor, causes the processor to provide on a computer screen a 2D scalable grid;
   a second sequence of instructions which, when executed by the processor, causes the processor to receive extrusion instructing inputs from a user;
   a third sequence of instructions which, when executed by the processor, causes the processor to perform extrusion computer graphical operations based on the extrusion instructing inputs, and the processor extruding whole multiples of an atomic portion of the grid;
   a fourth sequence of instructions which, when executed by the processor, causes the processor to present the extruded atomic grid portion on the computer screen for viewing and further manipulation by the user;

a fifth sequence of instructions which, when executed by the processor, causes the processor to accept commands from the user to shear user selected portions of the 2D scalable grid;

a sixth sequence of instructions which, when executed by the processor, causes the processor to perform shearing computer graphical operations based on the shear commands, the shearing computer graphical operations shearing the user selected portions of the 2D scalable grid;

a seventh sequence of instructions which, when executed by the processor, causes the processor to responsively display the sheared user selected portions of the 2D scalable grid;

an eighth sequence of instructions which, when executed by the processor, causes the processor to display the sheared portion from the selected portions of the 2D scalable grid as a sheared portion thereof which exhibits transformations formed according to the shearing commands from the user;

a ninth sequence of instructions which, when executed by the processor, causes the processor to accept commands from the user to twist user selected portions of the 2D scalable grid;

a tenth sequence of instructions which, when executed by the processor, causes the processor to perform grid twisting computer graphical operations based on the twisting commands, the grid twisting computer graphical operations twisting the user selected portions of the 2D scalable grid;

an eleventh sequence of instructions which, when executed by the processor, causes the processor to responsively display the twisted user selected portions of the 2D scalable grid;

a twelfth sequence of instructions which, when executed by the processor, causes the processor to display the twisted portion from the selected portions of the 2D scalable grid as a twisted extension thereof which exhibits transformations formed according to the twisting commands from the user;

a thirteenth sequence of instructions which, when executed by the processor, causes the processor to accept commands from the user to bend user selected portions of the 2D scalable grid;

a fourteenth sequence of instructions which, when executed by the processor, causes the processor to perform grid bending computer graphical operations based on the bending commands, the grid bending computer graphical operations bending the user selected portions of the 2D scalable grid;

a fifteenth sequence of instructions which, when executed by the processor, causes the processor to responsively display the bended user selected portions of the 2D scalable grid; and a sixteenth sequence of instructions which, when executed by the processor, causes the processor to display the bended portion from the selected portions of the 2D scalable grid as a bended extension thereof which exhibits transformations formed according to the bending commands from the user;

whereby each of the exhibited transformations cooperatively represent a 3D model.

3. A computer software product, comprising a non-transitory medium readable by a processor, the non-transitory medium having stored thereon a set of instructions implementing a 3D modeling user interface method, the set of instructions including:

a first sequence of instructions which, when executed by the processor, causes the processor to provide on a computer screen 2D scalable non-intersecting curves;

a second sequence of instructions which, when executed by the processor, causes the processor to receive extrusion instructing inputs from a user;

a third sequence of instructions which, when executed by the processor, causes the processor to perform extrusion computer graphical operations based on the extrusion instructing inputs thereby, the processor extruding whole multiples of an atomic portion of the non-intersecting curves based on the third sequence of instructions;

a fourth sequence of instructions which, when executed by the processor, causes the processor to present the extruded atomic non-intersecting curve portion on the computer screen for viewing further manipulation by the user;

wherein responsive to user input, the 2D scalable grid is positioned on a surface of a displayed object, the extruded atomic portion of the non-intersecting curves extending from the displayed object surface;

the non-intersecting curves being selected from the group including a plurality of user-defined concentric curves, and a plurality of user-defined wavy splines;

a fifth sequence of instructions which, when executed by the processor, causes the processor to process commands from the user to form concentric elliptical curves out of the user-defined concentric curves;

a sixth sequence of instructions which, when executed by the processor, causes the processor to process commands from the user to form concentric circles out of the user-defined concentric curves;

a seventh sequence of instructions which, when executed by the processor, causes the processor to accept commands from the user to adjust the amplitude of user-selected portions of the user-defined wavy splines;

an eighth sequence of instructions which, when executed by the processor, causes the processor to perform amplitude adjustment computer graphical operations based on the amplitude adjustment commands, the amplitude adjustment computer graphical operations adjusting the amplitude of the user selected portions of the user-defined wavy splines;

a ninth sequence of instructions which, when executed by the processor, causes the processor to responsively display the amplitude adjusted user selected portions of the user-defined wavy splines;

a tenth sequence of instructions which, when executed by the processor, causes the processor to accept commands from the user to adjust the frequency of user selected portions of the user-defined wavy splines;

an eleventh sequence of instructions which, when executed by the processor, causes the processor to perform frequency adjustment computer graphical operations based on the frequency adjustment commands, the frequency adjustment computer graphical operations adjusting the frequency of the user selected portions of the user-defined wavy splines;

a twelfth sequence of instructions which, when executed by the processor, causes the processor to responsively display the frequency adjusted user selected portions of the user-defined wavy splines;

a thirteenth sequence of instructions which, when executed by the processor, causes the processor to accept commands from the user to bend user selected portions of the user-defined wavy splines;

a fourteenth sequence of instructions which, when executed by the processor, causes the processor to perform bending adjustment computer graphical operations based on the bending commands, the bending adjustment computer graphical operations bending the user selected portions of the user-defined wavy splines;

a fifteenth sequence of instructions which, when executed by the processor, causes the processor to responsively display the bent user selected portions of the user-defined wavy splines;

a sixteenth sequence of instructions which, when executed by the processor, causes the processor to display the extruded portion from the selected portions of the 2D scalable grid as an extruded extension thereof which exhibits transformations formed according to the user amplitude adjustment, frequency adjustment and bending commands;

a seventeenth sequence of instructions which, when executed by the processor, causes the processor to accept commands from the user to adjust the eccentricity of the user-defined concentric curves;

an eighteenth sequence of instructions which, when executed by the processor, causes the processor to perform eccentricity adjustment computer graphical operations based on the eccentricity adjustment commands, the eccentricity adjustment computer graphical operations adjusting the eccentricity of the user-defined concentric curves;

a nineteenth sequence of instructions which, when executed by the processor, causes the processor to responsively display the eccentricity adjusted user-defined concentric curves;

a twentieth sequence of instructions which, when executed by the processor, causes the processor to accept commands from the user to pivot about a user selected point the eccentricity adjusted user-defined concentric curves;

a twenty-first sequence of instructions which, when executed by the processor, causes the processor to perform pivot computer graphical operations based on the pivot commands, the pivot computer graphical operations pivoting the eccentricity adjusted user-defined concentric curves about the user selected point;

a twenty-second sequence of instructions which, when executed by the processor, causes the processor to responsively display the pivoted eccentricity adjusted user-defined concentric curves; and a twenty-third sequence of instructions which, when executed by the processor, causes the processor to display the extruded portion from the selected portions of the 2D scalable grid as an extruded extension thereof which exhibits transformations formed according to the user eccentricity adjustment and pivot commands;

wherein responsive to user command the 2D scalable grid is positioned on a surface of a displayed object, the extruded atomic portion of the non-intersecting curves extending from the displayed object surface;

whereby each of the exhibited transformations cooperatively represent a 3D modeling.

* * * * *